(12) United States Patent
Christensen et al.

(10) Patent No.: US 12,254,863 B2
(45) Date of Patent: Mar. 18, 2025

(54) METHOD AND SYSTEM FOR GENERATING HARMONICS AS WELL AS AN AMPLITUDE PROPORTIONAL HARMONICS UNIT FOR VIRTUAL BASS SYSTEMS

(71) Applicant: DIRAC RESEARCH AB, Uppsala (SE)

(72) Inventors: Søren Skovgaard Christensen, Dyssegaard (DK); Pedro Højen-Sørensen, Allerød (DK); Morten Rolle Hansen, Hellerup (DK); Johannes Röjder, Uppsala (SE)

(73) Assignee: DIRAC RESEARCH AB, Uppsala (SE)

( * ) Notice: Subject to any disclaimer, the term of this patent is extended or adjusted under 35 U.S.C. 154(b) by 241 days.

(21) Appl. No.: 18/246,018

(22) PCT Filed: Sep. 21, 2021

(86) PCT No.: PCT/SE2021/050904
§ 371 (c)(1),
(2) Date: Mar. 20, 2023

(87) PCT Pub. No.: WO2022/066085
PCT Pub. Date: Mar. 31, 2022

(65) Prior Publication Data
US 2023/0360630 A1    Nov. 9, 2023

Related U.S. Application Data

(60) Provisional application No. 63/083,363, filed on Sep. 25, 2020.

(51) Int. Cl.
*G10K 15/02* (2006.01)
*G10K 11/178* (2006.01)

(52) U.S. Cl.
CPC ........ *G10K 15/02* (2013.01); *G10K 11/17853* (2018.01)

(58) Field of Classification Search
CPC ...... H04R 3/04; H04R 2430/03; H04R 25/48; H03G 5/165; H03G 9/025; H03G 3/3005; H03G 3/00; G10K 15/02; G10K 11/17853
(Continued)

(56) References Cited

U.S. PATENT DOCUMENTS

| | | |
|---|---|---|
| 6,111,960 A * | 8/2000 | Aarts ................ H04R 3/00 381/98 |
| 7,847,176 B2 * | 12/2010 | Sugawara ............... G10H 1/16 84/622 |

(Continued)

FOREIGN PATENT DOCUMENTS

| | | |
|---|---|---|
| CN | 111970627 A | 11/2020 |
| WO | 9926454 A1 | 5/1999 |

(Continued)

OTHER PUBLICATIONS

International Search Report and Written Opinion mailed Nov. 1, 2021, issued in corresponding International Application No. PCT/SE2021/050904, filed Sep. 21, 2021, 14 pages.

(Continued)

*Primary Examiner* — Norman Yu
(74) *Attorney, Agent, or Firm* — Christensen O'Connor Johnson Kindness PLLC

(57) ABSTRACT

There is provided a method and corresponding system for generating harmonics based on an input signal. The method comprises deriving (S1), from the input signal, one or more frequency band signals; generating (S2), from at least one or each of said frequency band signals, a first amplitude proportional signal comprising one or more harmonics com- (Continued)

ponents, said first amplitude proportional signal having an amplitude proportional to the amplitude of the input signal; generating (S3), from at least one or each of said frequency band signals, a normalized signal, said normalized signal having an amplitude independent of the amplitude of the input signal, and multiplying, for at least one or each of said frequency band signals, the normalized signal with the corresponding first amplitude proportional signal to generate a second amplitude proportional signal comprising one or more harmonics components; and creating (S4), for at least one or each of said frequency band signals, an output signal based on the first amplitude proportional signal comprising one or more harmonics components and the second amplitude proportional signal comprising one or more harmonics components.

20 Claims, 27 Drawing Sheets

(58) Field of Classification Search
USPC ..... 381/61, 98, 104, 17, 102, 103, 106, 119, 381/120, 18
See application file for complete search history.

(56) References Cited

U.S. PATENT DOCUMENTS

| 10,382,857 B1 | 8/2019 | Khanal et al. |
| 2009/0052695 A1* | 2/2009 | Yamada ................ H03G 9/025 381/101 |
| 2019/0098407 A1* | 3/2019 | Faller ..................... H04R 3/04 |

FOREIGN PATENT DOCUMENTS

| WO | 2017202460 A1 | 11/2017 |
| WO | 2019077374 A1 | 4/2019 |
| WO | 2020101548 A1 | 5/2020 |
| WO | 2021188953 A1 | 9/2021 |

OTHER PUBLICATIONS

Lee, T., et al., "Virtual Bass System Based on a Multiband Harmonic Generation," Consumer Electronics (ICCE), 2013 IEEE International Conference, Jan. 11-14, 2013, 2 pages.

International Preliminary Report on Patentability mailed Aug. 10, 2022, issued in corresponding International Application No. PCT/SE2021/050904, filed Sep. 21, 2021, 7 pages.

* cited by examiner

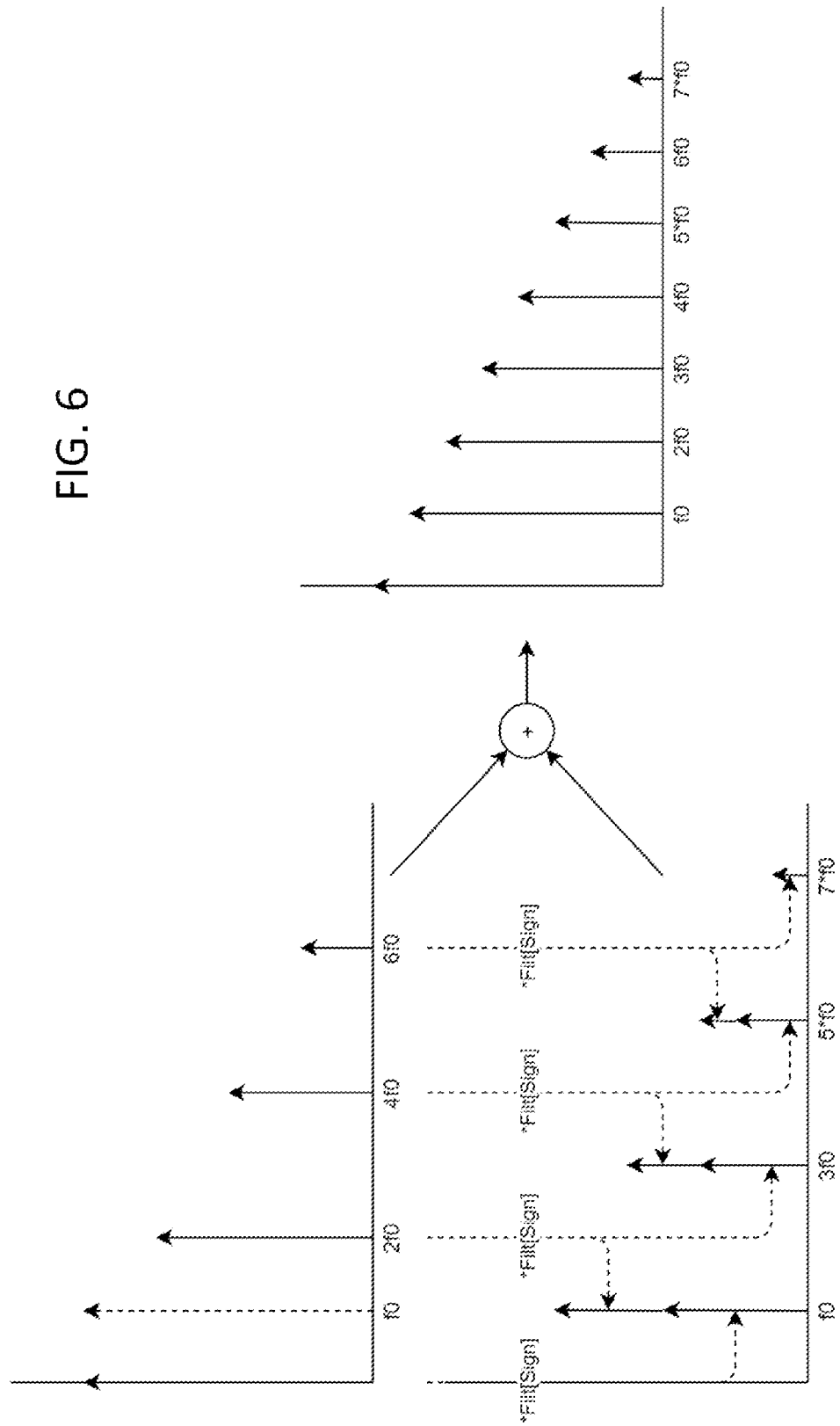

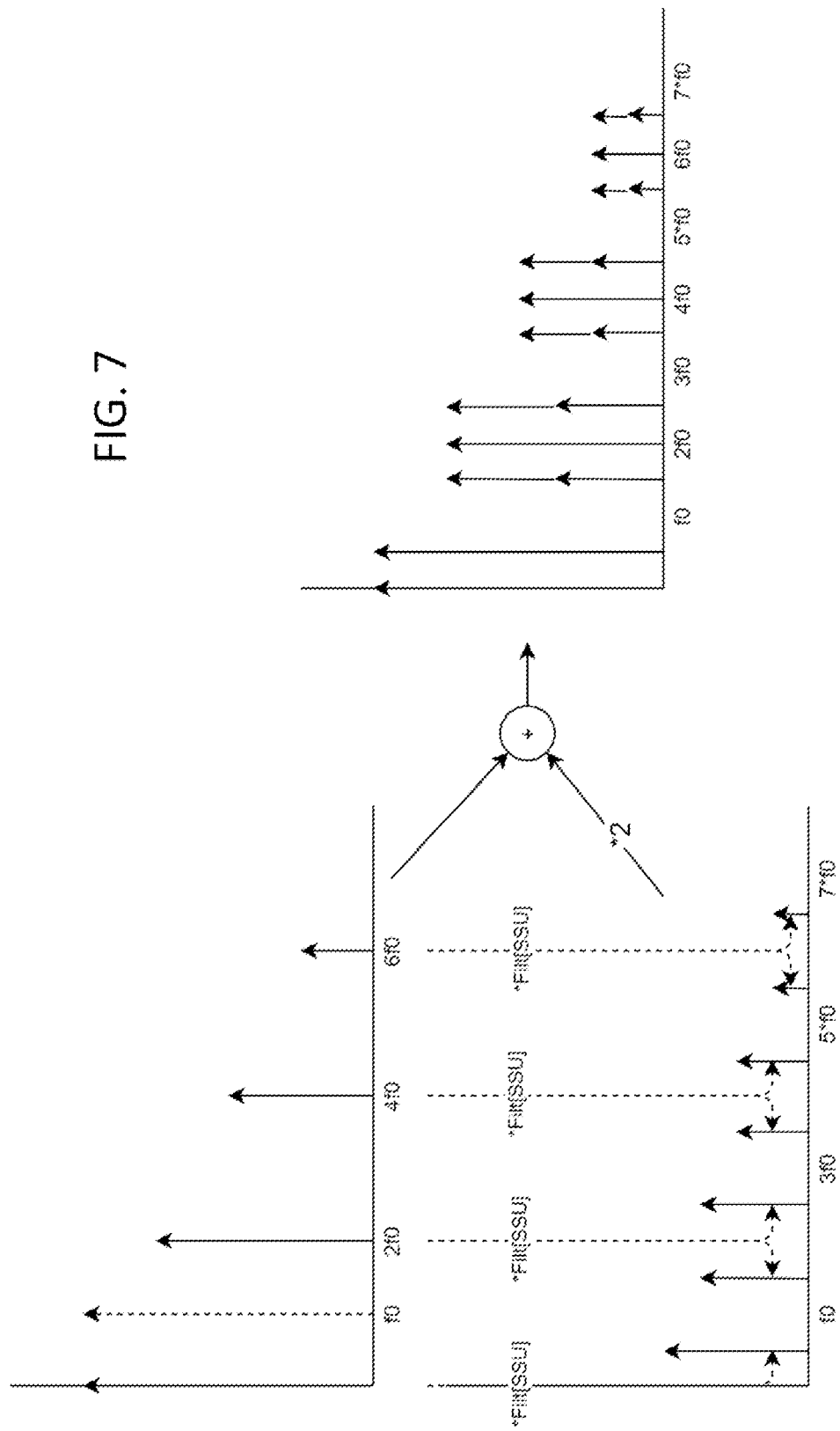

METHOD AND SYSTEM FOR GENERATING HARMONICS AS WELL AS AN AMPLITUDE PROPORTIONAL HARMONICS UNIT FOR VIRTUAL BASS SYSTEMS

TECHNICAL FIELD

The proposed technology generally relates to audio processing, and more particularly to a method and system for generating harmonics, a system for generating a virtual bass signal, also referred to as a psycho-acoustic bass sensation signal, an amplitude proportional harmonics unit for a virtual bass system, an audio processing system as well as a corresponding overall audio system and a computer program and computer-program product, and a corresponding apparatus.

BACKGROUND

Due to physical limitations small sized loudspeakers/drivers are not able to efficiently reproduce low-frequency audio content; this can lead to undesirable loss of bass sensation (which plays a major role in the overall perceived audio quality) and in worst case complete loss of musical content.

However, due to a psychoacoustic illusion known as "the missing fundamental phenomenon" it is possible give the listener the illusion of the presence of a fundamental frequency even though is it not physically reproduced, so-called Virtual Bass, Virtual Bass Enhancement or Psycho-Acoustic Bass Enhancement. The phenomenon is based on the observation that perceived pitch of a set of harmonics (i.e. integer multiple of the fundamental) is determined not only by the fundamental of the harmonic sound but also by the greatest common divisor of the frequencies present. In general, the aim of Virtual Bass systems is therefore to generate (at least two) harmonics which falls within the frequency range which can be reproduced by the playback system and thereby give the listener the sensation of improved bass.

It is well-known that a non-linear device (NLD) can be used for generating harmonics. For example, the full wave rectifier can be used to generate the even harmonics, the half wave rectifier produces the fundamental plus even harmonics and the full wave integrator can be used to generate both the even and odd harmonics. Through time a host of different NLDs have been studied in context of Virtual-Bass Systems (see e.g. reference [1]). However, one limitation of most NLDs is that they result in a different low-frequency perception at low input signal level compared to high input signal level. This is caused by the fact that in most non-linear devices, the generated harmonics have amplitudes which are non-linearly related to the input signal level, i.e. they are not amplitude-proportional. In order to deal with that problem reference [2] suggests introduction of a level detector which is used for normalizing the input to the harmonics generator and thereby allowing the freedom to generate any combination of odd and even harmonics and its amplitude relation to the fundamental harmonic.

FIG. 1 is a schematic diagram showing a conventional (narrow band) virtual bass generating circuit including a harmonic generator circuit based on NLD. The input signal is first processed by a low-pass filter (to prevent intermodulation distortion) with a cutoff frequency set to the upper limit of the required low-frequency extension. The low-pass signal is then processed by the NLD to generate harmonics components. The NLD output is passed through a bandpass filter to shape the harmonics and to remove intermodulation components below the physical range of the playback system. The harmonics are then added to the high-pass filtered input signal.

FIG. 2 is a schematic diagram illustrating a common (wide band) extension used in Virtual Bass systems based on NLDs. For example, reference can be made to [2]. Here the input spectrum is divided into small bands and assigning separate harmonics generator to each band in order to reduce intermodulation distortion produced during harmonics generation when more than one strong low frequency component may be present at the input of the harmonics generator.

Although, the prior art offers some possibilities of providing Virtual Bass or Psycho-Acoustic Bass Enhancement signals, there is still a general demand for providing new and improved developments with respect to generating harmonics in an audio system.

SUMMARY

It is a general object to provide new and improved developments with respect to the process of generating harmonics in an audio system.

It is a specific object to provide a system for generating harmonics.

It is also an object to provide a system for generating a virtual bass signal, also referred to as a psycho-acoustic bass sensation signal.

A particular object is to provide an amplitude proportional harmonics unit for a virtual bass system.

Yet another object is to provide an audio processing system.

Still another object is to provide a corresponding overall audio system.

It is another object to provide a method for generating harmonics.

It is also an object to provide a computer program and computer-program product.

Yet another object is to provide a corresponding apparatus configured to perform a method for generating harmonics.

These and other objects are met by embodiments of the proposed technology.

According to a first aspect, there is provided a system for generating harmonics. The system basically comprises:
- an input for receiving an input signal having a fundamental frequency;
- at least two signal paths:
  - a first signal path configured to receive the input signal and configured to generate a first amplitude proportional signal comprising one or more harmonics components based on the input signal, the first amplitude proportional signal having an amplitude proportional to the amplitude of the input signal;
  - a second signal path configured to receive the input signal, the second signal path comprising at least one signal processing block configured to i) generate a normalized signal based on the input signal, the normalized signal having an amplitude independent of the amplitude of the input signal, and ii) multiply the normalized signal with the first amplitude proportional signal to generate a second amplitude proportional signal comprising one or more harmonics components; and
- a combiner configured to generate an output signal based on the first amplitude proportional signal comprising one or more harmonics components and the second amplitude proportional signal comprising one or more harmonics components.

According to a second aspect, there is provided a system for generating a virtual bass signal, also referred to as a psycho-acoustic bass sensation signal, wherein this system for generating a virtual bass signal comprises the system for generating harmonics according to the first aspect.

According to a third aspect, there is provided an arrangement comprising multiple instances of the system for generating harmonics according to the first aspect, wherein these multiple instances of the system for generating harmonics may be arranged in parallel and/or in a series arrangement.

According to a fourth aspect, there is provided an audio processing system that comprises a system for generating harmonics according to the first aspect, a system for generating a virtual bass signal according to the second aspect and/or an arrangement according to the third aspect.

According to a fifth aspect, there is provided an audio system comprising an audio processing system according to the fourth aspect.

According to a sixth aspect, there is provided a method for generating harmonics based on an input signal having a fundamental input frequency. The method basically comprises:
- deriving, from the input signal, one or more frequency band signals;
- generating, from at least one or each of the frequency band signals, a first amplitude proportional signal comprising one or more harmonics components, the first amplitude proportional signal having an amplitude proportional to the amplitude of the input signal;
- generating, from at least one or each of the frequency band signals, a normalized signal, the normalized signal having an amplitude independent of the amplitude of the input signal, and multiplying, for at least one or each of the frequency band signals, the normalized signal with the corresponding first amplitude proportional signal to generate a second amplitude proportional signal comprising one or more harmonics components;
- creating, for at least one or each of the frequency band signals, an output signal based on the first amplitude proportional signal comprising one or more harmonics components and the second amplitude proportional signal comprising one or more harmonics components.

According to a seventh aspect, there is provided a computer program for generating, when executed by a processor, harmonics from an input signal having an input frequency, wherein the computer program comprises instructions, which when executed by the processor, cause the processor to perform the method according to the sixth aspect.

According to an eighth aspect, there is provided a computer-program product comprising a non-transitory computer-readable medium having stored thereon a computer program according to the seventh aspect.

According to a ninth aspect, there is provided an apparatus configured to perform the method according to the sixth aspect.

By way of example, the proposed technology may employ a unique combination of properly configured components to generate a first amplitude-proportional harmonics series and a second amplitude-proportional harmonics series that are mixed together in a well-balanced manner and generally proportional to the input signal amplitude.

Furthermore, by way of example, the proposed amplitude proportional harmonics generator technology can be configured to provide fractional harmonics in addition to natural (even/odd) harmonics.

A related aspect of the invention concerns an approach in which natural harmonics generation and fractional harmonics generation are arranged in parallel branches and subsequently combined.

In general, the proposed technology provides new and improved ways of generating harmonics in an audio system.

Other advantages will be appreciated when reading the following detailed description of non-limiting embodiment of the invention.

BRIEF DESCRIPTION OF DRAWINGS

The embodiments, together with further objects and advantages thereof, may best be understood by making reference to the following description taken together with the accompanying drawings, in which:

FIG. 6 is a schematic diagram illustrating an example of how a harmonics series may be generated by the APHU unit.

FIG. 7 is a schematic diagram showing that other types of harmonics series are also possible.

DETAILED DESCRIPTION

Throughout the drawings, the same reference designations are used for similar or corresponding elements.

Figure 1:
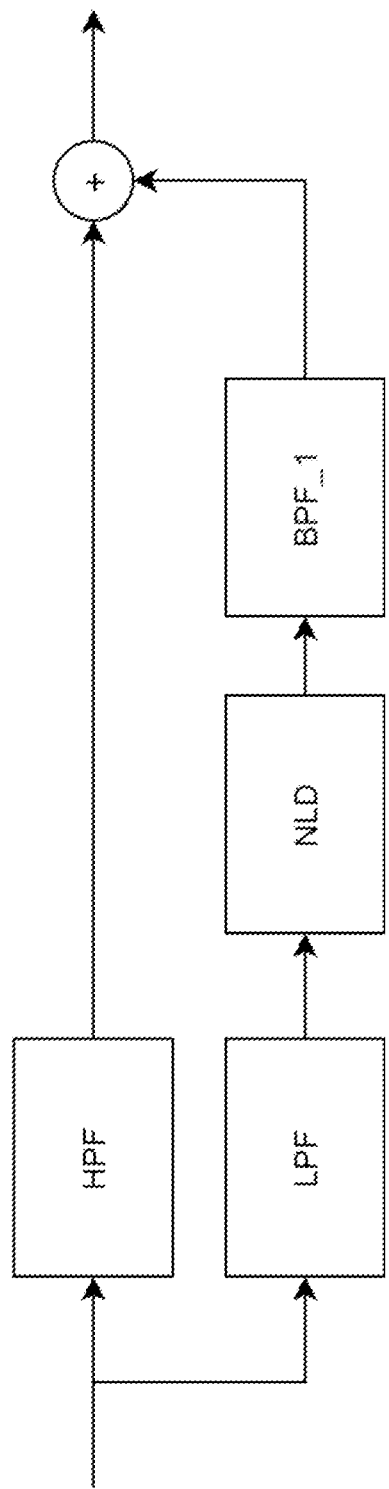
FIG. 1 is a schematic diagram showing a conventional (narrow band) virtual bass generating circuit including a harmonic generator circuit.
Figure 2:
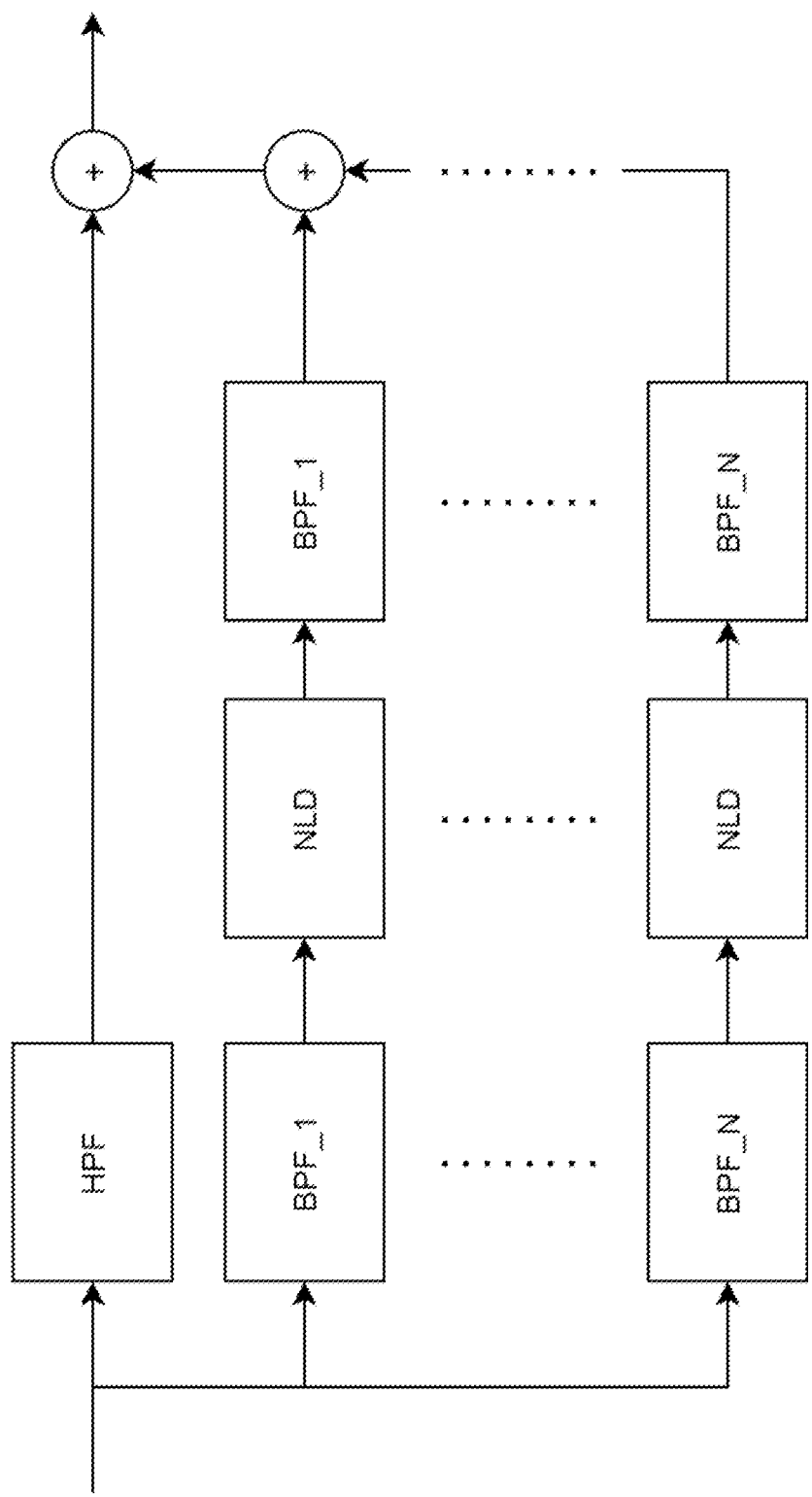
FIG. 2 is a schematic diagram illustrating a common (wide band) extension used in Virtual Bass systems.
Figure 3:
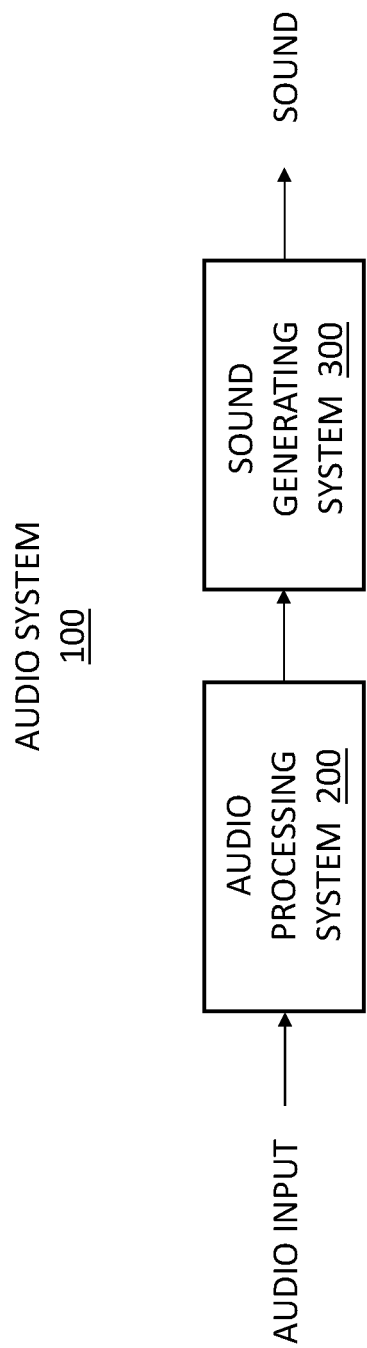
FIG. 3 is a schematic block diagram illustrating a simplified example of an audio system.

It may be useful to start with an audio system overview with reference to FIG. 3, which illustrates a simplified audio system. The audio system 100 basically comprises an audio processing system 200 and a sound generating system 300. In general, the audio processing system 200 is configured to process one or more audio input signals which may relate to one or more audio channels. The filtered audio signals are forwarded to the sound generating system 300 for producing sound.

As mentioned, for proper sound reproduction in some audio systems, the generation of harmonics from an input signal having a fundamental frequency is highly important.

According to a first aspect, there is provided a system for generating harmonics. The system basically comprises:
an input for receiving an input signal having a fundamental frequency;
at least two signal paths:
a first signal path configured to receive the input signal and configured to generate a first amplitude proportional signal comprising one or more harmonics components based on the input signal, the first amplitude proportional signal having an amplitude proportional to the amplitude of the input signal;
a second signal path configured to receive the input signal, the second signal path comprising at least one signal processing block configured to i) generate a normalized signal based on the input signal, the normalized signal having an amplitude independent of the amplitude of the input signal, and ii) multiply the normalized signal with the first amplitude proportional signal to generate a second amplitude proportional signal comprising one or more harmonics components; and
a combiner configured to generate an output signal based on the first amplitude proportional signal comprising one or more harmonics components and the second amplitude proportional signal comprising one or more harmonics components.

By way of example, the first signal path may be configured to generate the first amplitude proportional signal as having one or more natural harmonics, and the second signal path may be configured to generate the second amplitude proportional signal as i) having one or more natural harmonics or ii) as having one or more fractional harmonics.

In a particular example, the first signal path is configured to generate the first amplitude proportional signal as including an even harmonics series, and the second signal path is configured to generate the second amplitude proportional signal as including an odd harmonics series.

In another example, the first signal path is configured to generate the first amplitude proportional signal as including an even or odd harmonics series, and the second signal path is configured to generate the second amplitude proportional signal as including at least one fractional harmonics component. By way of example, the second signal path may comprise:
a SIGN unit for generating a sequence of changing signs alternating at a rate dictated by the fundamental frequency of the input signal,
a filtering unit configured to filter the sequence of changing signs to generate the normalized signal having an amplitude independent of the amplitude of the input signal, and
a mixing multiplier configured to multiply the normalized signal with the first amplitude proportional signal to generate the second amplitude proportional signal.

For example, the SIGN unit and the filtering unit may be configured to generate the normalized signal as one or more filtered sign sequences that are used as amplitude independent estimates of the fundamental frequency of the input signal.

In a particular example, the second signal path further comprises a frequency divider or multiplier arranged between the SIGN unit and the filtering unit to produce a sequence of changing signs with a period according to the pure tone input and configuration/setting of the frequency divider or multiplier, wherein the filtering unit is configured to receive the sequence of changing signs to generate the normalized signal, thereby enabling fractional harmonics to be generated as part of the second amplitude proportional signal when the normalized signal is multiplied with the first amplitude proportional signal.

Optionally, the first signal path may comprise at least one signal processing block configured to generate the first amplitude proportional signal.

For example, said at least one signal processing block of the first signal path may comprise a Non-Linear Device, NLD, configured to participate in generating the first amplitude proportional signal.

As an example, the NLD may comprise an absolute value unit, ABS( ), for generating a series of natural harmonics that scales proportionally to the input signal.

Alternatively, the first signal path is configured to simply pass-through the input signal as the first amplitude proportional signal.

In a particular example, the system further comprises a first gain multiplier configured to scale the first amplitude proportional signal and/or a second gain multiplier configured to scale the second amplitude proportional signal, wherein the combiner is configured to receive the scaled first amplitude proportional signal and/or the scaled second amplitude proportional signal as input for generating the output signal.

By way of example, the system may be implemented as a so-called Amplitude Proportional Harmonics Unit, APHU.

According to a second aspect, there is provided a system for generating a virtual bass signal, also referred to as a psycho-acoustic bass sensation signal, wherein this system for generating a virtual bass signal comprises the system for generating harmonics according to the first aspect.

More specifically, the proposed technology may thus provide an Amplitude Proportional Harmonics Unit (APHU) for a virtual bass system.

According to a third aspect, there is provided an arrangement comprising multiple instances of the system for generating harmonics according to the first aspect, wherein these multiple instances of the system for generating harmonics may be arranged in parallel and/or in a series arrangement.

According to a fourth aspect, there is provided an audio processing system that comprises a system for generating harmonics according to the first aspect, a system for generating a virtual bass signal according to the second aspect and/or an arrangement according to the third aspect.

According to a fifth aspect, there is provided an audio system comprising an audio processing system according to the fourth aspect.

By way of example, the proposed technology may employ a unique combination of properly configured components to generate a first amplitude-proportional (e.g. even) harmonics series and a second amplitude-proportional (e.g. odd) harmonics series that are mixed together in a well-balanced manner and generally proportional to the input signal amplitude.

For example, the proposed technology may be used for generating a Virtual Bass signal, also referred to as a Psycho-Acoustic Bass enhancement or sensation signal. In particular, there is provided a system 100; 200 for generating a virtual bass signal, also referred to as a psycho-acoustic bass sensation signal, wherein the system 100; 200 for generating a virtual bass signal comprises a system for generating harmonics.

Figure 4:
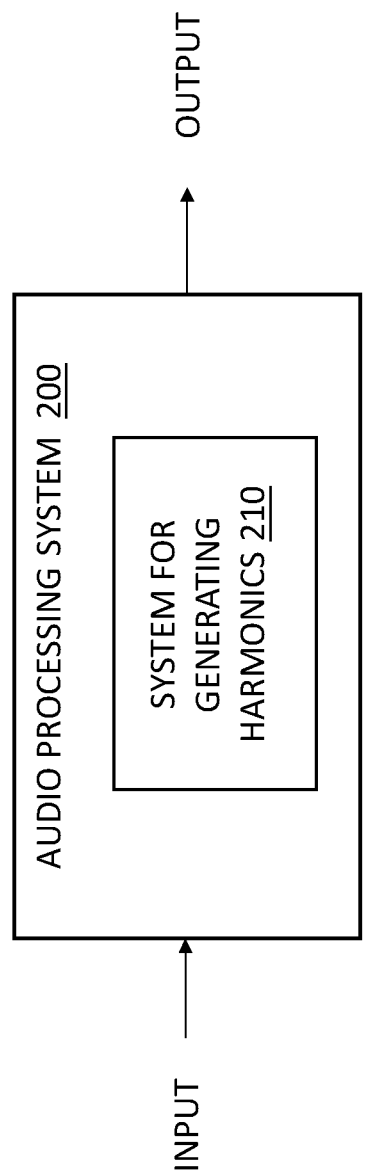
FIG. 4 is a schematic diagram illustrating an example of a system for generating harmonics according to an embodiment.

FIG. 4 is a schematic diagram illustrating an example of an audio processing system including a system for generating harmonics according to an embodiment.

In this particular example, there is provided an audio processing system 200 comprising a system 210 for generating harmonics. The system 210 for generating harmonics is sometimes referred to as a harmonics generator and/or includes a harmonics generator. Furthermore, there is provided an overall audio system 100 comprising such an audio processing system 200.

For a better understanding, the invention will now be described with reference to additional, non-limiting examples.

Figure 5A:
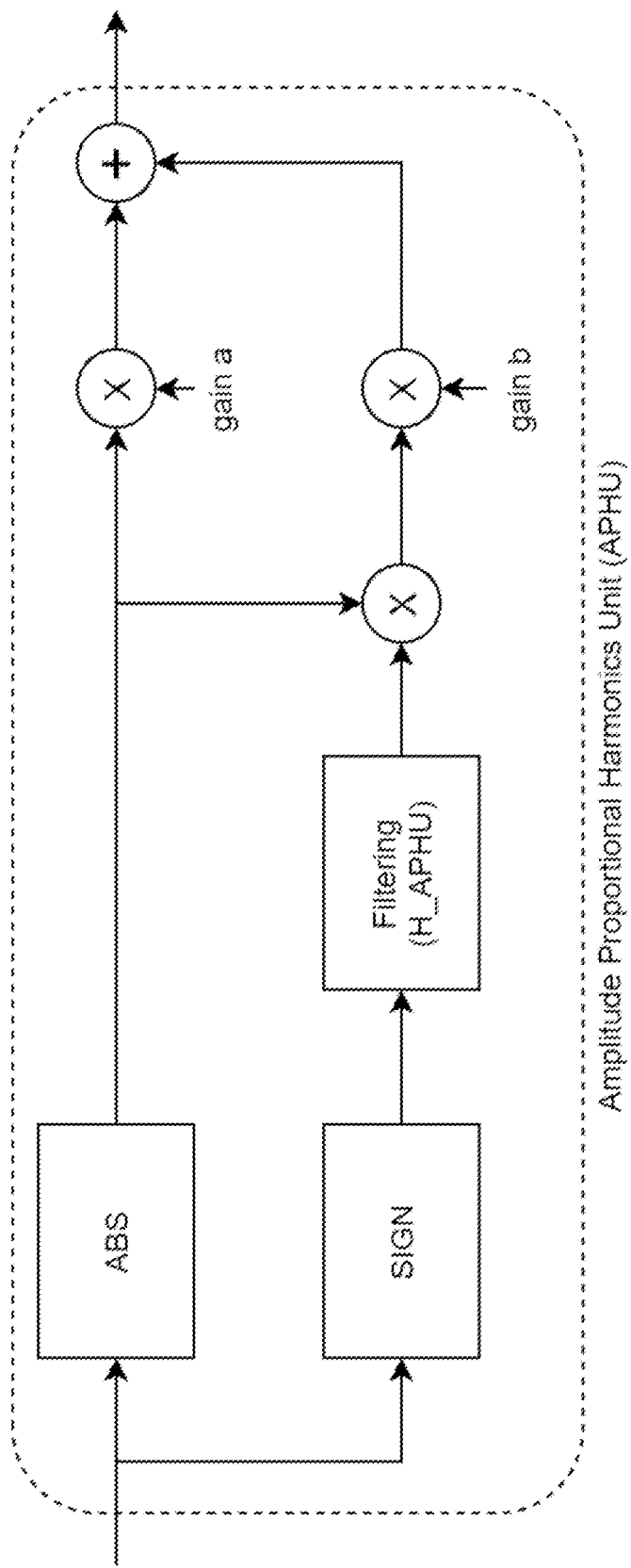
FIG. 5A is a schematic diagram illustrating a non-limiting example of a harmonics generator, also referred to as an Amplitude Proportional Harmonics Unit (APHU).

FIG. 5A is a schematic diagram illustrating a non-limiting example of an APHU unit. The APHU unit is composed of two parallel tracks, a first comprising an ABS( ) unit and a first gain multiplier, and a second track comprising a SIGN unit( ), a filtering module, a mixing multiplier and a second gain multiplier. The ABS( ) function generates even harmonics and ensures that the harmonics series scales proportionally to the input amplitude. The sequence of changing signs (+/−1) which is generated as the output of SIGN( ) function alternates at the rate dictated by the fundamental frequency of the input. A level independent estimate of the fundamental is obtained by low-pass filtering this sequence. The normalized fundamental is then multiplied with the harmonics series generated by the ABS( ) function which results in a series containing odd harmonics. The even and odd harmonics series are then scaled individually (by "gain a" and "gain b") and added together to form a balanced mix of odd and even harmonics.

In other words, the proposed technology employs a unique combination of properly configured components to generate an (amplitude-proportional) even harmonics series and an (amplitude-proportional) odd harmonics series that are mixed together in a well-balanced manner and generally proportional to the input signal amplitude.

Figure 5B:
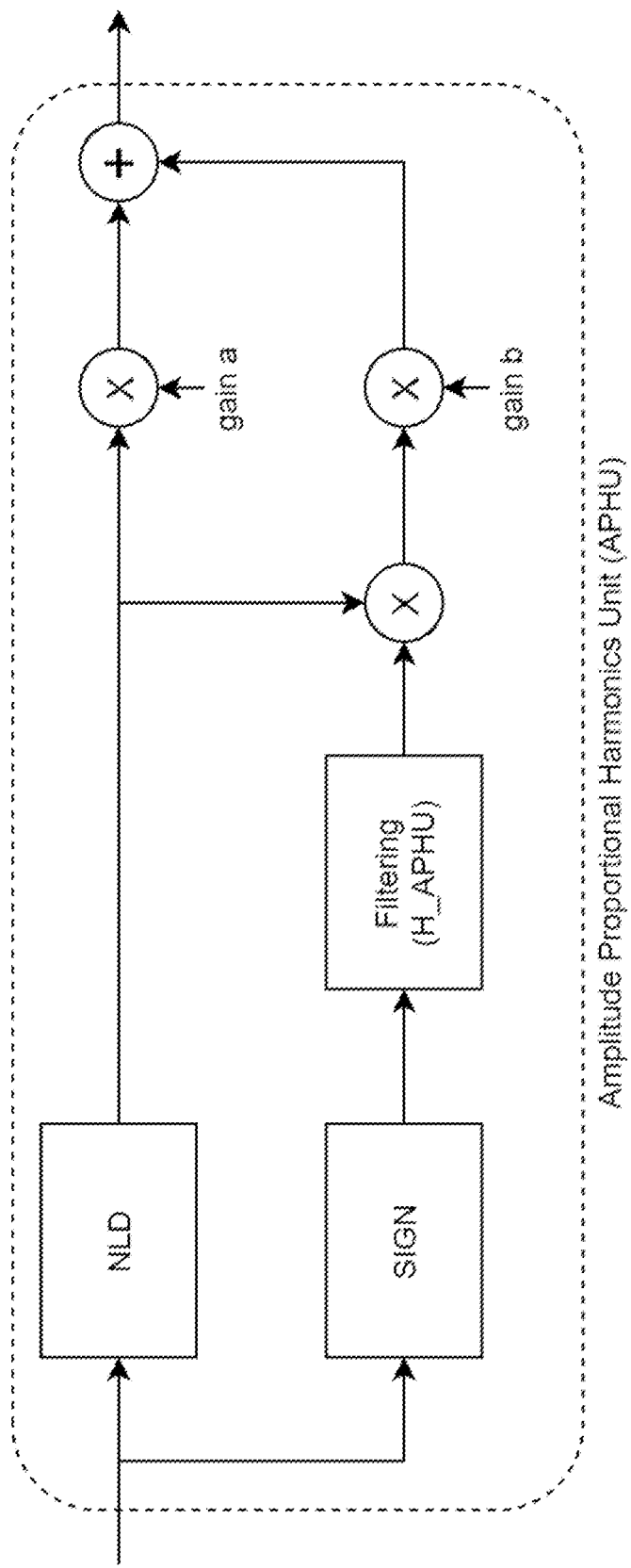
FIG. 5B is a schematic diagram illustrating another non-limiting example of an APHU.

FIG. 5B is a schematic diagram illustrating another non-limiting example of an APHU. The example of FIG. 5B is similar to that of FIG. 5A except for the ABS unit being replaced by another (or more general) amplitude-proportional non-linear device (NLD), which is used together with the filtered output of the SIGN( ) function.

Figure 5C:
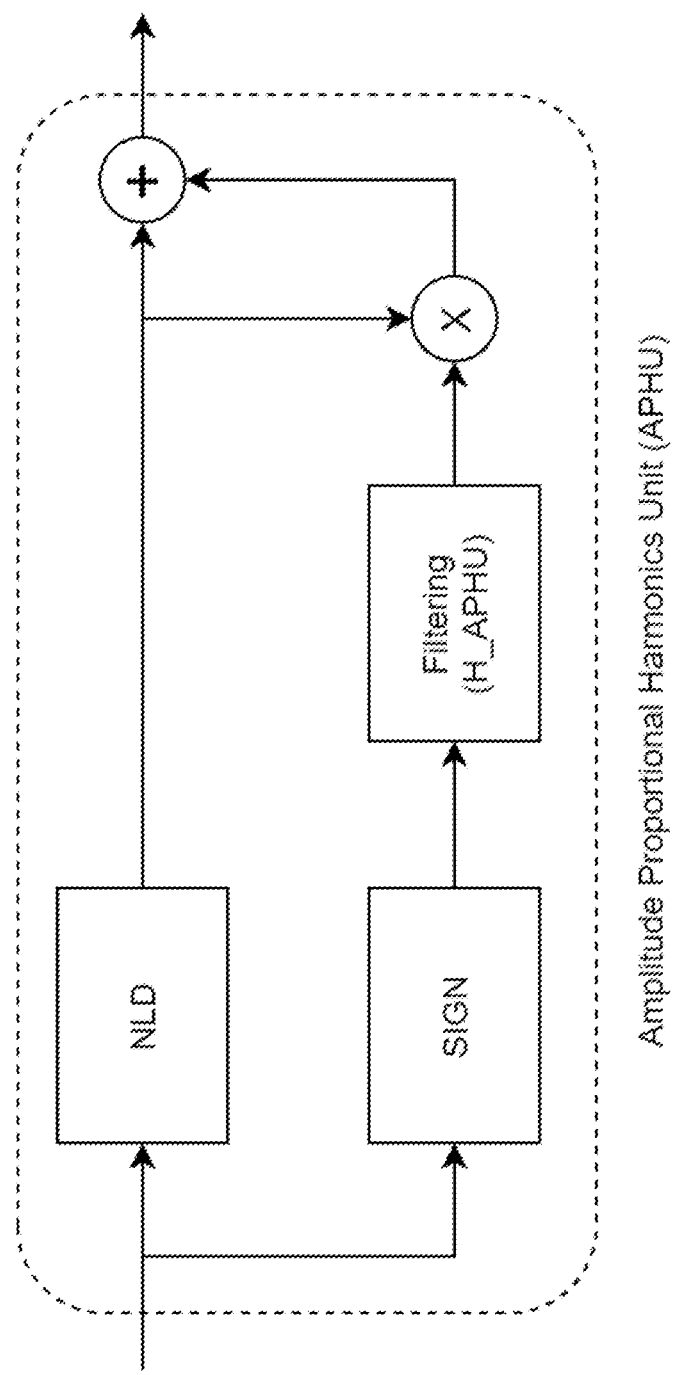
FIG. 5C is a schematic diagram illustrating yet another non-limiting example of an APHU.

FIG. 5C is a schematic diagram illustrating yet another non-limiting example of an APHU. In this example, the scaling factors "gain a" and "gain b" have been set to 1, effectively reducing the component count of the overall circuit since the gain multipliers can be removed. This effectively means that the even and odd harmonics series are added together without any scaling in advance.

It may be useful to continue with a brief, non-limiting discussion of certain insights and key considerations, eventually leading to the new evolved architecture for harmonics generation.

A Non-Linear Device (NLD) is generally a static memoryless non-linear element/unit that may be good at handling transients. As a counter-example: the full wave integrator, commonly used as harmonic generator, inherently causes the output to lag relative to the input. Effectively such suboptimal transient behaviour can be heard as a "pumping bass" in certain tracks. Due to integration the output peaks will come in the end of the periods hence lagging after the input.

A drawback of most NLDs is that they provide an amplitude dependent harmonic shaping. Harmonics are generally not scaled by a level detector as in reference [2].

The inventors have realized that it may be beneficial to use filtered sign sequences to obtain input-amplitude independent estimates of the fundamental which, in combination with a NLD, can be used to generate new harmonics to the ones generated by the NLD (the full-wave rectifier produces even harmonics having a fixed amplitude relation with the fundamental).

Typically, the full-wave rectifier is simple to implement but generates only even harmonics. This corresponds to the perceived pitch being a full octave higher than the target pitch perception.

In reference [3], they solve this problem by adding a soft-clipping circuit to generate the odd harmonics.

The inventors have realized that it may be better to obtain the odd harmonics by multiplying the amplitude proportional even harmonics with an amplitude independent (normalized) estimate of the fundamental. As a result, generating an amplitude proportional odd harmonic series.

It may be desirable to generate a harmonics series, which will not depend (beyond a common scaling) on the magnitude of the input signal. This can be a problem for static non-linear systems. In order to deal with this, it is common to use a so-called level detector, which can scale the output of the NLD.

In clear contrast, the inventors here suggest a methodology which can be used for extending harmonics components to the ones naturally produced by the NLD in such a way that the resulting harmonics series remains invariant to the magnitude of the input signal. The concept of amplitude proportional harmonic corresponds to all harmonics scaling proportionally with the input amplitude.

In the prior art, amplitude is preserved by means of envelope tracking in each section.

In clear contrast, the Amplitude Proportional Harmonics Unit (APHU) by nature generates a full (unlimited) amplitude proportional harmonic series that optionally may be shaped/limited afterwards by means of filtering.

The principle of the missing fundamental is based on the importance to use both odd and even harmonics for creating a sensation of a clean and deep bass. By way of example, assuming pure tone input, it may be desirable to generate harmonics where odd and even harmonics have roughly the same harmonic gain distribution (timbre), the amplitude of the harmonics is proportional to the input amplitude, there is little inherent signal "memory" to provide a good transient response, and control of the timbre.

References [1], [4] and [5] provide a thorough review and analysis of all currently available methods for low-frequency sound reproduction, and it can be noted that these references do not mention and do not refer to anything that resembles the inventive solution proposed in this patent application.

Figure 5D:
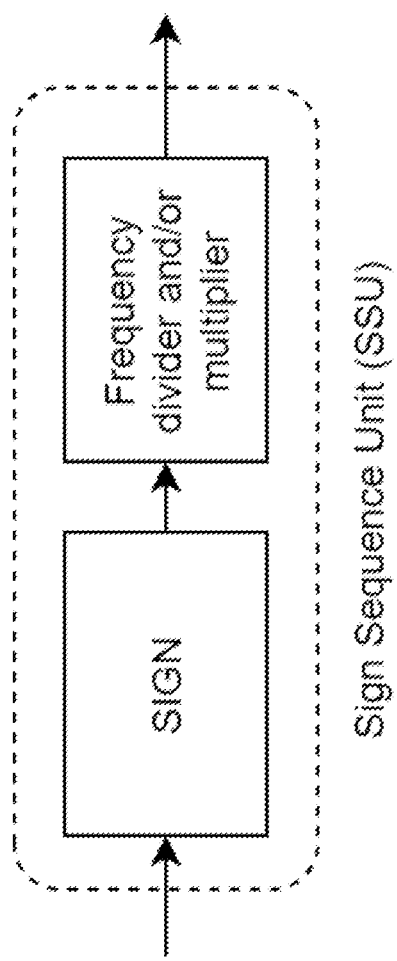
FIG. 5D is a schematic diagram illustrating an example of sub-module called Sign Sequence Unit (SSU) useful for producing a new square waveform with a period according to the pure tone input and choice of configuration of the divider and/or multiplier.

FIG. 5D is a schematic diagram illustrating an example of sub-module called Sign Sequence Unit (SSU) useful for producing a new square waveform with a period according to the pure tone input and choice of configuration of the divider and/or multiplier. The APHU can in that way be configured to generate a diverse set of amplitude-proportional fractional harmonics series. For more information on how to construct frequency dividers and multipliers as such, reference can be made to reference [6]. For example, frequency dividers and multipliers may be implemented by using standard components such as flip-flops, which are commonly used in logical designs and circuits.

Figure 5E:
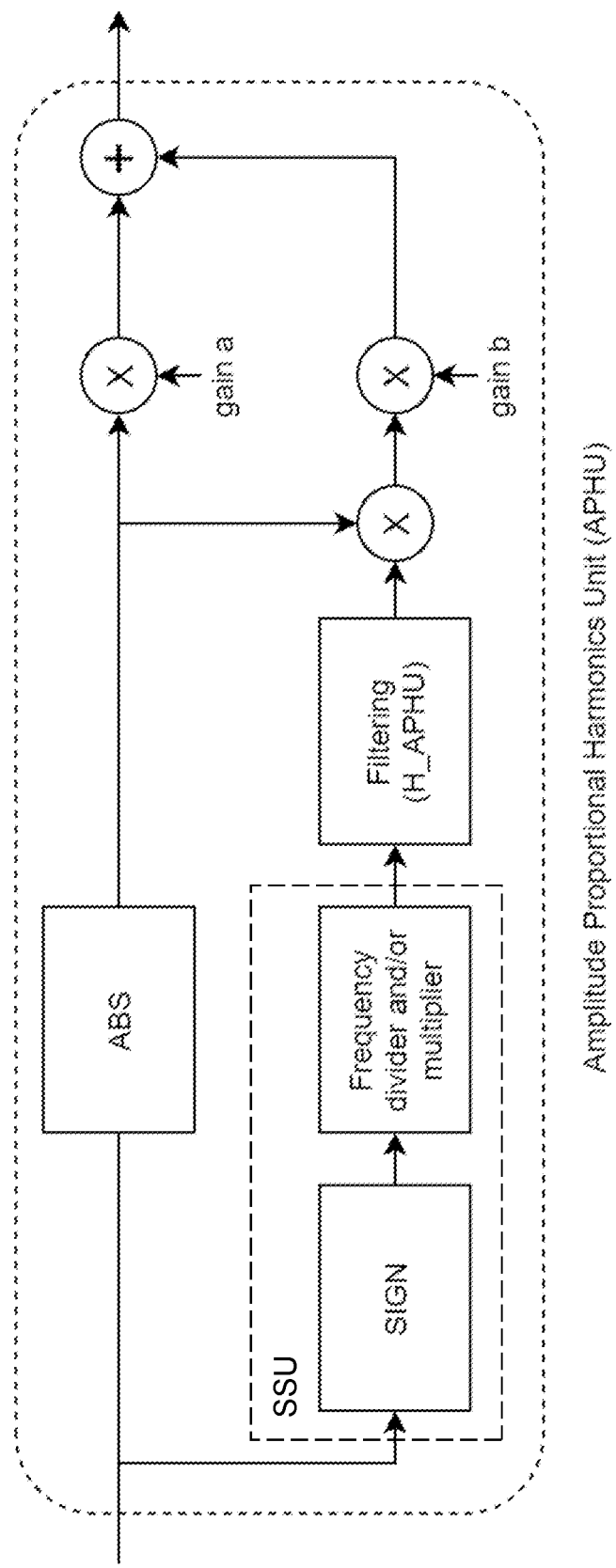
FIG. 5E is a schematic diagram illustrating an example of how the APHU can be configured to generate fractional harmonics by using a SSU comprising a frequency divider and/or frequency multiplier.

FIG. 5E is a schematic diagram illustrating an example of how the APHU can be configured to generate fractional harmonics by using a SSU comprising a frequency divider and/or frequency multiplier. The net effect is that the APHU unit now generates an amplitude-proportional fractional harmonics series.

Figure 5F:
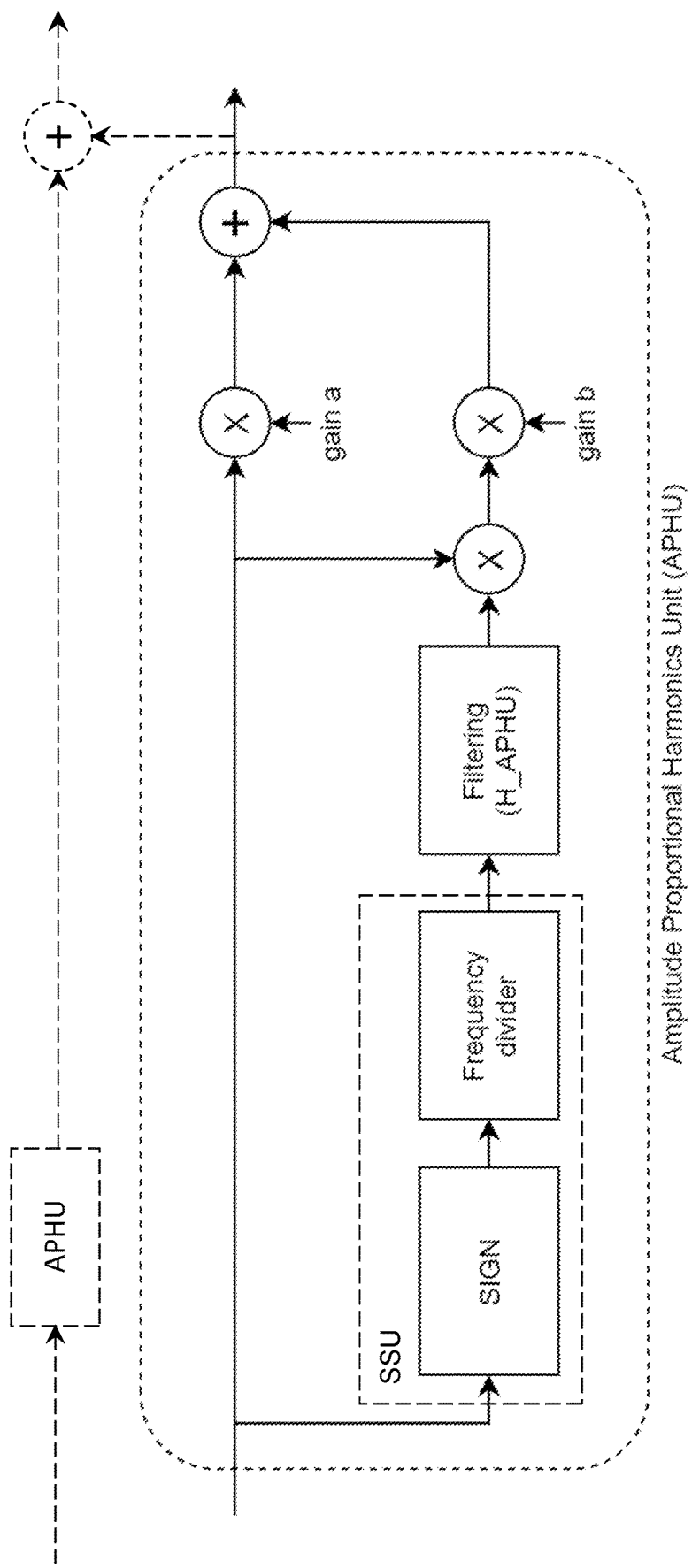
FIG. 5F is a schematic diagram illustrating a particular example of how the APHU can be configured to generate fractional harmonics by using a SSU comprising a frequency divider after the SIGN( ) function.

FIG. 5F is a schematic diagram illustrating a particular example of how the APHU can be configured to generate fractional harmonics by using a SSU comprising a frequency divider after the SIGN( ) function. In this example, it is shown how the APHU can be configured to generate fractional harmonics by using a frequency divider after the SIGN( ) function, e.g. ½ f0, 3/2 f0. Here also, the net effect is that the APHU unit now generates an amplitude-proportional fractional harmonics series. It can be also be noted that when generating fractional harmonics, a possible mode of operation includes simply omitting the ABS( ) unit.

Optionally, as indicated by the dashed upper signal path in FIG. 5F, the output signal can be combined in an optional further combiner with another amplitude proportional signal from an optional signal path configured for processing the input signal.

Figure 5G:
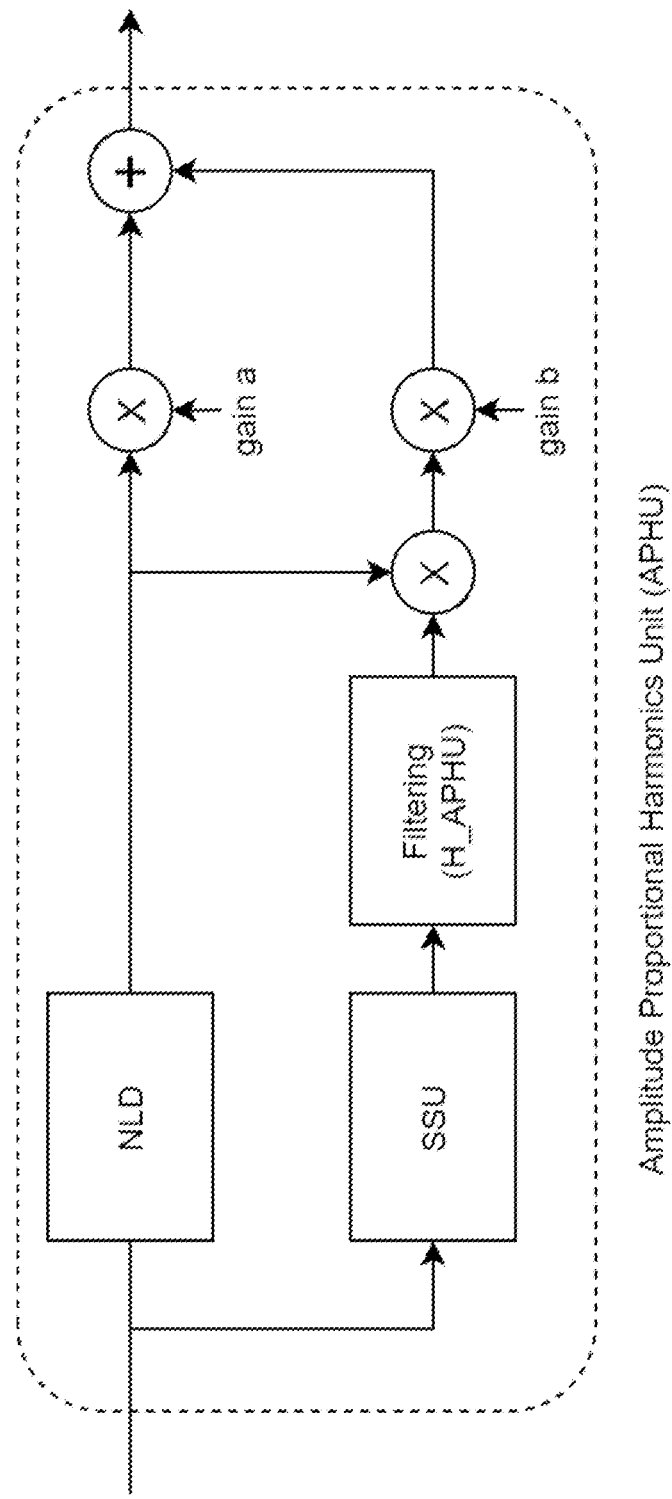
FIG. 5G is a schematic diagram illustrating an example of how the APHU can be configured to generate fractional harmonics by using a NLD and a SSU.

FIG. 5G is a schematic diagram illustrating an example of how the APHU can be configured to generate fractional harmonics by using a NLD and a SSU in combination with a filtering step. In the example where the NLD is the ABS unit it will correspond to FIG. 5E, while FIG. 5F represents the example where the NLD has been configured to be a simple pass-through unity function.

Figure 5H:
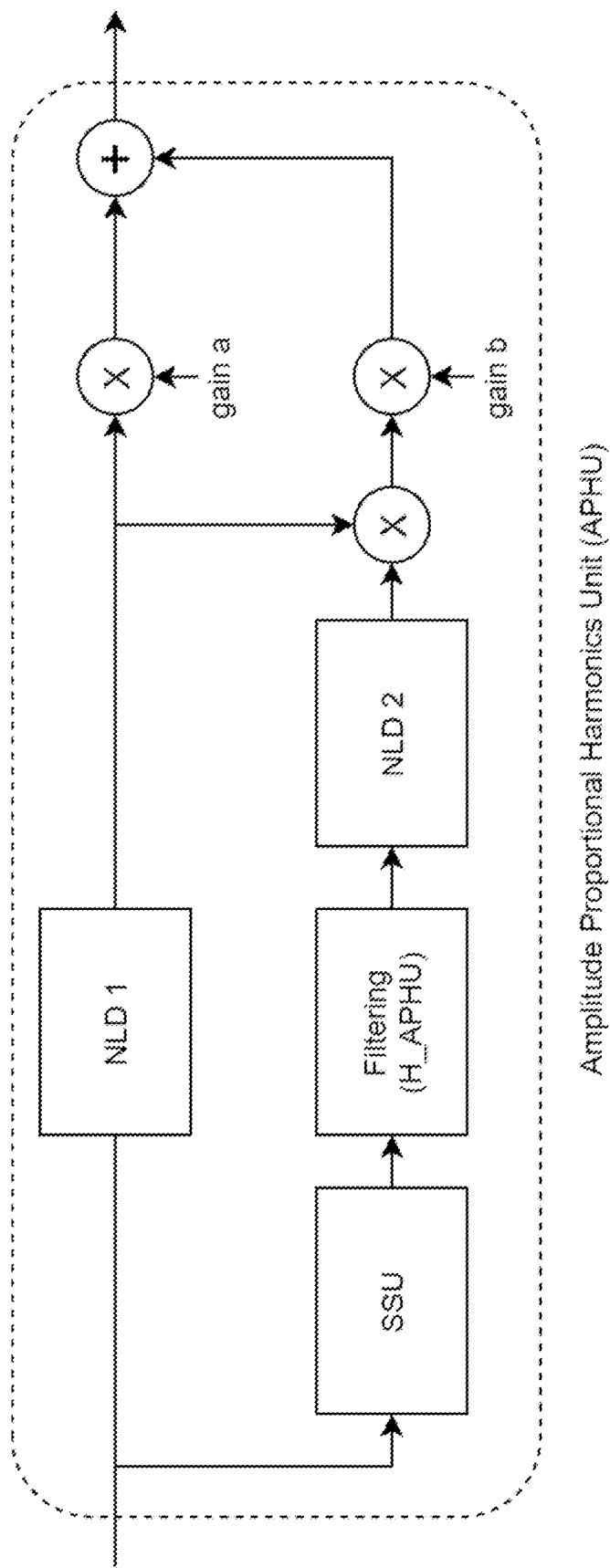
FIG. 5H is a schematic diagram illustrating an example of how the APHU can be configured to generate fractional harmonics by using an additional NLD after the filtered sign sequence.

FIG. 5H is a schematic diagram illustrating an example of how the APHU in FIG. 5G can be extended with a second NLD after the filtered sign sequence. NLD 2 is not required to have the same properties as the NLD 1. An example can be where NLD 2 is configured to be a polynomial-based NLD.

It is appreciated that each of the different non-limiting realizations of a harmonics generator APHU conveyed in FIG. 5A-FIG. 5H can be used on its own or in combination with other signal processing blocks such as filters, compressors, and limiters.

For a better understanding of the extension for producing fractional harmonics the following additional information can also be given.

For example, for a pure tone input, the SIGN function in APHU produces a square waveform (of +1/−1) with a period corresponding to the fundamental frequency of the pure tone. In a variant of the APHU unit, a standard frequency divider (or multiplier) unit is applied after the SIGN function. It produces a new square waveform with a period according to the pure tone input and choice of divider. The net effect is that the APHU unit now generates an amplitude-proportional fractional harmonics series.

Examples of the APHU variation for producing a fractional harmonics series is shown in FIG. 5E, FIG. 5F, FIG. 7 and FIG. 9.

It can also be noted that the usage of fractional harmonics in combination with even/odd natural (integer) harmonics can be beneficial in certain audio systems for creating the desired bass sensation.

An example of a general integer/fractional amplitude proportional harmonics generation architecture is illustrated in FIG. 5E.

An example of a general amplitude proportional harmonics generation architecture that also uses a NLD after the filtered sign sequence is illustrated in FIG. 5H. NLD 1 should be configured to generate proportional harmonics (e.g. by letting it be a unity function or a full/half wave rectifier). In the lower branch, the SSU and the filter H_APHU ensures that output does not scale with input amplitude. It is possible to configure NLD 2 more freely, e.g. as a polynomial-based NLD. For more information on polynomial-based NLDs as such, please refer to references [1] and [7].

From a method perspective, the proposed technology provides one or more novel procedures for generating harmonics.

According to a sixth aspect, there is provided a method for generating harmonics based on an input signal having a fundamental input frequency.

Figure 21:
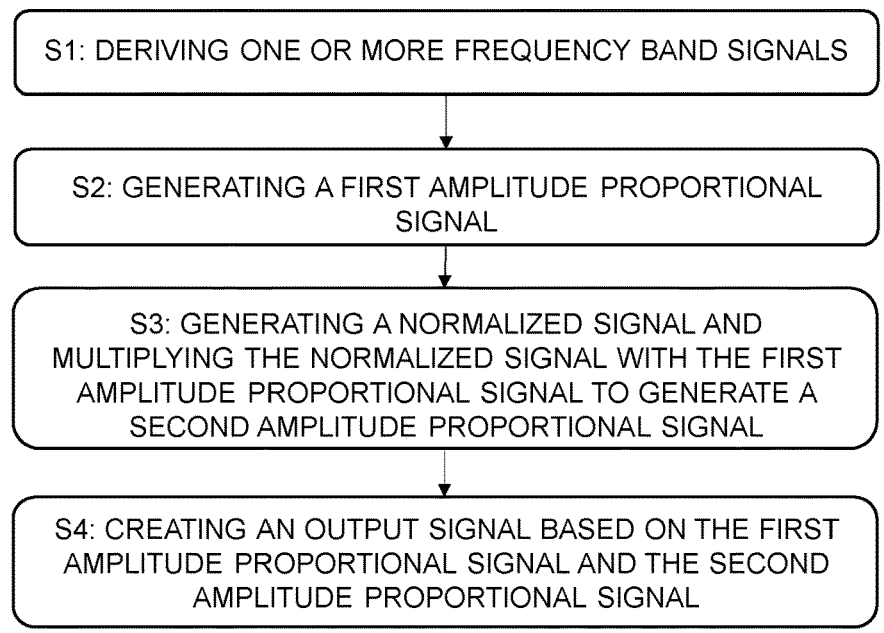
FIG. 21 is a schematic diagram illustrating an example of a method for generating harmonics based on an input signal having a fundamental input frequency.

With reference to FIG. 21, the method basically comprises:
  S1: deriving, from the input signal, one or more frequency band signals;

S2: generating, from at least one or each of the frequency band signals, a first amplitude proportional signal comprising one or more harmonics components, the first amplitude proportional signal having an amplitude proportional to the amplitude of the input signal;

S3: generating, from at least one or each of the frequency band signals, a normalized signal, the normalized signal having an amplitude independent of the amplitude of the input signal, and multiplying, for at least one or each of the frequency band signals, the normalized signal with the corresponding first amplitude proportional signal to generate a second amplitude proportional signal comprising one or more harmonics components; and S4: creating, for at least one or each of the frequency band signals, an output signal based on the first amplitude proportional signal comprising one or more harmonics components and the second amplitude proportional signal comprising one or more harmonics components.

By way of example, the first amplitude proportional signal may include one or more natural harmonics, and the second amplitude proportional signal may include one or more natural harmonics or one or more fractional harmonics.

In a particular example, the first amplitude proportional signal includes an even harmonics series, and the second amplitude proportional signal includes an odd harmonics series.

In another example, the first amplitude proportional signal includes an even or odd harmonics series, and the second amplitude proportional signal includes at least one fractional harmonics component.

As an example, the step of generating, from at least one or each of said frequency band signals, a first amplitude proportional signal comprises using the frequency band signal as input to a Non-Linear Device, NLD, and using the output of the NLD as the amplitude proportional signal.

In a particular example, the step of generating, from at least one or each of the frequency band signals, a normalized signal comprises generating a sign sequence from said at least one or each of the frequency bands signals, and applying a filter to the sign sequence to create a filtered sign sequence signal.

For example, the step of generating, from at least one or each of the frequency band signals, a normalized signal further comprises using the filtered sign sequence signal as input to a further NLD and using the output of the further NLD as the normalized amplitude signal.

By way of example, the step of generating, from at least one or each of the frequency band signals, a normalized signal further comprises manipulating the change-rate of the sign sequence.

Optionally, the step of creating, for at least one or each of the frequency band signals, an output signal comprises providing weighted versions of the first amplitude proportional signal and the second amplitude proportional signal and combining the weighted versions to generate the output signal.

In a particular example, a method for generating harmonics from an audio input signal, may comprise at least a subset of the following steps:

1) from the input, deriving one or more frequency band signals,
2) from at least one or each of said frequency band signals, creating a first amplitude proportional signal, said first amplitude proportional signal having an amplitude proportional to the amplitude of the input, optionally by:
   a. using the frequency band signal as input to a first (generalized) Non-Linear Device, NLD, and
   b. using the output of said first (generalized) NLD as the amplitude proportional signal,
3) from at least one or each of said frequency band signals, creating a normalized amplitude signal, said normalized amplitude signal having an amplitude independent of the amplitude of the input, e.g. by:
   a. generating a sign sequence from one of said frequency bands signals,
   b. applying a filter to said sign sequence, creating a filtered sign sequence signal,
   c. optionally using said filtered sign sequence signal as input to a second (generalized) NLD, and
   d. using the output of said second (generalized) NLD (which may or may not have the same properties as the first generalized NLD) as the normalized amplitude signal,
4) multiplying, for at least one or each of said frequency band signals, the first amplitude proportional signal with the normalized amplitude signal, creating a second amplitude proportional signal, having a signal amplitude responding proportionally to changes in the amplitude of the input, and
5) creating, for at least one or each of said frequency band signals, a harmonics signal from at least said second amplitude proportional signal.

In a particular example, the method may further comprise the step of creating an output signal based on said harmonics signal(s) and the input signal.

As an example, the step of creating an output signal may be performed by combining optionally weighted versions of the harmonics signal(s) and the input signal (e.g. in the form of the first amplitude proportional signal).

Optionally, the generalized NLDs may or may not generate harmonics from its input frequencies and furthermore, at least one of the first or second (generalized) NLD is a non-trivial (generalized) NLD, characterized in that the output of said NLD comprises harmonics of the input frequency.

As mentioned, the first (generalized) NLD may have an output amplitude proportional to its input amplitude.

By way of example, at least one of the first or second (generalized) NLD is a non-trivial (generalized) NLD, characterized in that for a sinusoidal input signal to said NLD, the output of said NLD comprises harmonics of the input frequency.

For example, the first (generalized) NLD may be defined through its property as being a non-linear device for generating harmonics that scales proportionally to the amplitude of the fundamental In a particular example, the first (generalized) NLD is represented by a unity mapping, a half wave rectifier, or a full wave rectifier.

In a sense, the proposed technology may be characterized by extracting at least one low-frequency band from an input signal. From this band, an amplitude proportional signal is created, and a normalized amplitude signal is created. The product of these two signals is taken and this product is used to create a harmonics signal. The amplitude proportional signal may also be included in the harmonics signal. From the same band or other band(s), yet one or several other harmonics signals may be created in a similar fashion. All harmonics signals are then combined, and the result is further combined with the input signal, creating an output signal.

The amplitude proportional signals may further be characterized in that its amplitude responds proportionally to changes in the input amplitude.

Herein, for the purposes of understanding the concept "amplitude-proportional", amplitude relates to the maximum excursion that a waveform takes. Hence, an amplitude-proportional system can be defined by the property that a change in the input amplitude results in a proportional change in the output amplitude. Thus, the expression amplitude-proportional is commonly used herein, keeping in mind that the expression amplitude-proportional may also be referred to as magnitude-proportional.

For further clarification, it can be stated that an amplitude-normalized system has an output not affected by changes in the input amplitude. In the special case where the amplitude of the input signal is 0, the amplitude-normalized system is open for implementation-specific behavior.

By way of example, the normalized amplitude signal(s) may be created using a cascade of at least a sign-detection unit, an optional unit for manipulating the change-rate of the sign sequence and as a mandatory last step a filter. The normalized amplitude signal may be characterized in that its amplitude does not respond to changes in the input amplitude.

In a particular example, at least one of the amplitude proportional signal(s) or normalized amplitude signal(s) is, prior to the multiplication step, further processed by an additional harmonics generation unit. A harmonics generation unit is here characterized in that for a sinusoidal input, its output contains harmonics of the input frequency. In the case that an amplitude proportional signal is enhanced by such a harmonics generation unit, said harmonics generation should also have an amplitude-proportional property, such that its output responds proportionally to changes in its input signal.

It can be understood that the sign detection stage essentially removes any information about input amplitude. Hence, it is a natural consequence that the normalized amplitude signal is amplitude normalized. It can also be understood that the multiplication stage(s), multiplying an amplitude proportional signal with a normalized amplitude signal, will result in yet another amplitude proportional signal.

FIG. 6 is a schematic diagram illustrating an example of how a harmonics series may be generated by the APHU. In the upper left panel, the fundamental f0 (dash harmonics) is presented as input to the ABS( ) non-linearity which in turn generates the even harmonics (indicated by the solid harmonic components). The lower left panel shows the result of multiplying the lowpass filtered sign function with the harmonics series generated by the ABS( ) non-linearity. The net result of the multiplication is that each harmonic component is split into two odd harmonics. The right panel shows the result of scaling the even harmonics series (generated by ABS( ) and the odd harmonics series (generated by ABS( )*Filt(Sign)) and adding them together.

FIG. 7 is a schematic diagram showing that other types of harmonics series are possible by simply changing the nature of the Sign Sequence Unit (SSU) such that it relates to other rational ratios of the fundamental frequency. In this example, the rate of the sign change is designed to match half the fundamental (i.e. f0/2). In this case the result of the multiplication ABS( )*Filt(SSU) is a harmonic series in which each of the even harmonics (from the ABS) have been split into two components (still centered around the harmonics components) but this time only f0 apart. The right panel shows the result of adding the two harmonics signals together. Since the distance between harmonic components in the resulting harmonic series in this case is f0/2 the pitch would be perceived to be one octave lower (i.e. sub-bass).

Figure 8A:
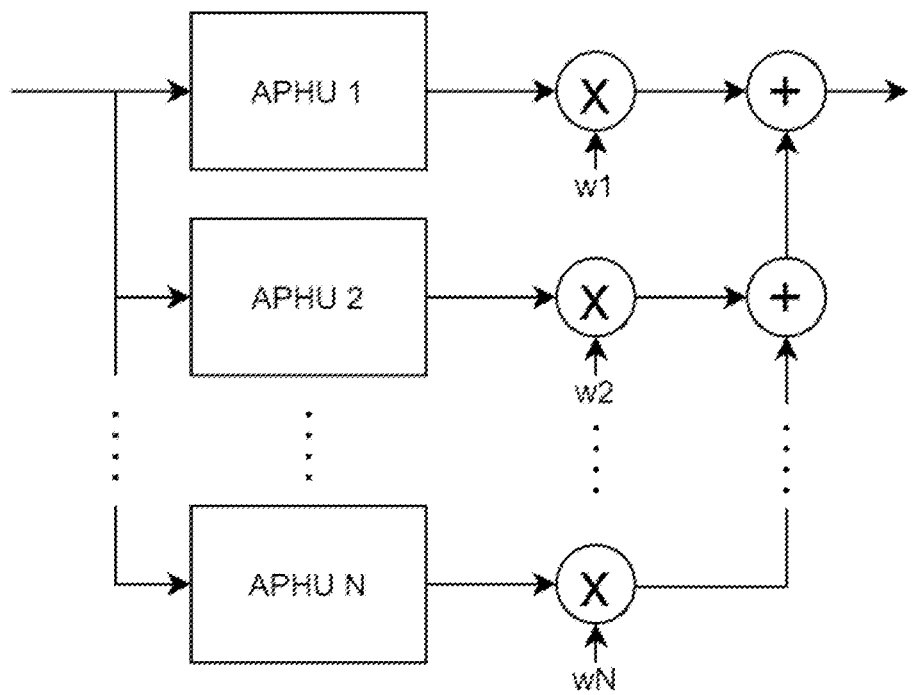
FIG. 8A is a schematic diagram illustrating an example of an extension of the basic configuration into multiple parallel branches, which allows for additional flexibility in the construction of the harmonic series.

FIG. 8A is a schematic diagram that illustrates an example of an extension which allows for additional flexibility in the construction of the harmonic series. The additional flexibility is obtained by having parallel branches with APHUs which each carries out "spectral splitting" of the harmonic components generated by the NLD using different types of Sign Sequence Units (SSUs). The final result is then obtained as a weighted sum (using weights w1, w2 . . . wN) of all the harmonics series generated by each branch.

Figure 8B:
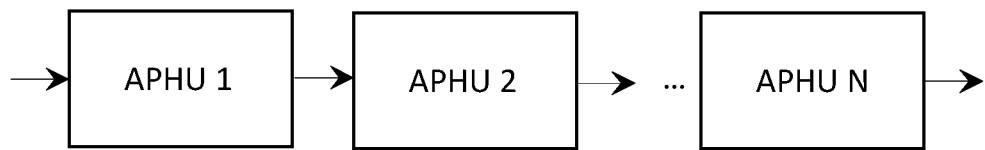
FIG. 8B is a schematic diagram illustrating an example of a series arrangement of multiple system instances (e.g. implemented as APHUs).

It should be understood that it is also possible to use, as input to an APHU, the resulting output from another APHU. In other words, as schematically indicated in FIG. 8B, it is feasible to provide a series connection of two or more APHUs, where the output of an APHU is used as input to another APHU. This may be considered as a form of serial cascading of APHUs.

Figure 9:
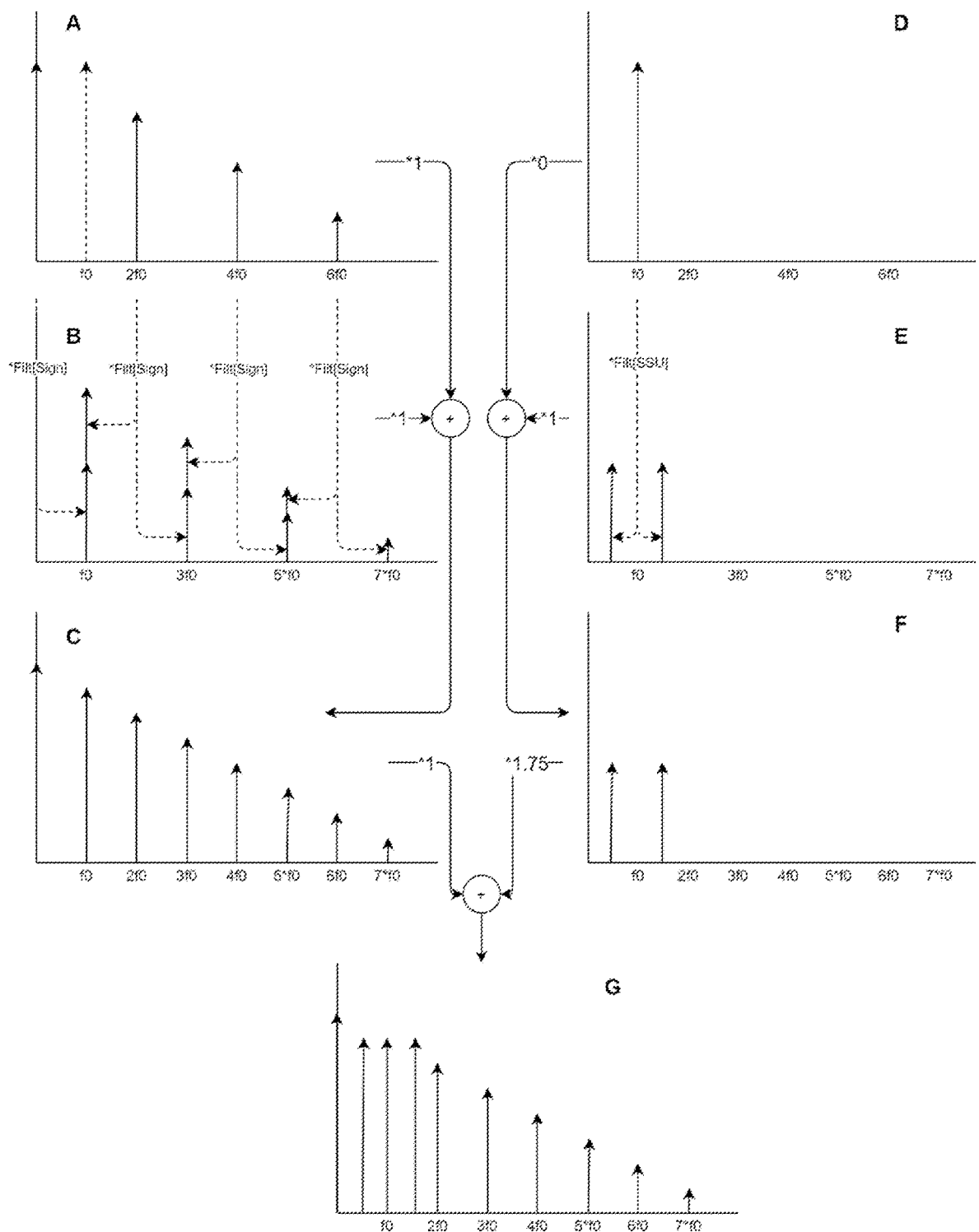
FIG. 9 is a schematic diagram that shows an example of how the harmonics series can be shaped by using the extension shown in FIG. 8.

FIG. 9 is a schematic diagram that shows an example of how the harmonics series can be shaped by combining different instances of the APHU. This is a concrete example of using the extension shown in FIG. 8A.

In this example, this is illustrated using the instances of the harmonics generator units shown in FIG. 5A and FIG. 5F. In panel A the fundamental f0 (dashed harmonic) is presented as input to the ABS( ) non-linearity (of the APHU instance illustrated in FIG. 5A) which in turn generates the even harmonics (indicated by the solid harmonic components). Panel B shows the result of "spectral splitting" the harmonics (indicated by dashed line) which results from multiplying the lowpass filtered sign function with the harmonics series generated by the ABS( ) non-linearity. The resulting output from the APHU instance illustrated in FIG. 5A is shown in panel C. In panel D the fundamental f0 is presented as input to the instance of the APHU illustrated in FIG. 5F. In this case, there is no non-linearity present in the upper branch. Panel E shows the result of "spectral splitting" the input fundamental (indicated by dashed line) in this case using an SSU where the frequency divider is set up to divide by 2 to compute f0/2. By linear combining the result from the two different instances of the APHU we arrive at the harmonics series illustrated in panel G which will then be a mix of natural harmonics (integer multiple of the fundamental) and fractional harmonics (fractional multiple of the fundamental). It can be noted that Panel F corresponds to Panel E since there is a zero multiplication from Panel D.

Figure 10:
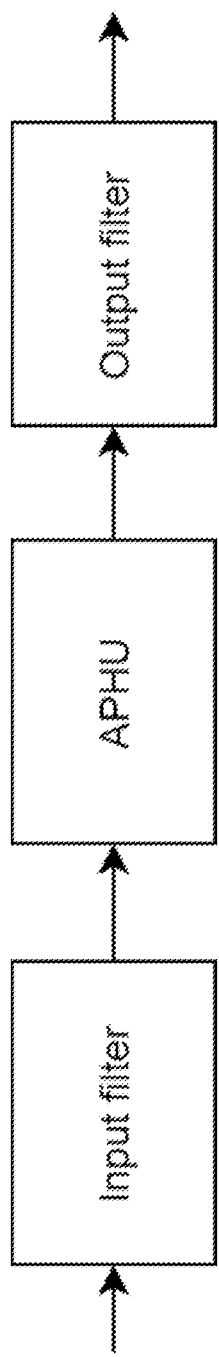
FIG. 10 is a schematic diagram that shows an example embodiment of a system configuration where the input signal is filtered by an input filter before the APHU processes the signal.

FIG. 10 is a schematic diagram that shows an example embodiment of a system configuration where the input signal is filtered by an input filter before the APHU unit processes the signal. The harmonics series generated by the APHU unit is then filtered by an output filter which, for example, can be used for further shaping of the harmonics components. The input and output filters can either be IIR or FIR filters that are used to e.g. amplify or attenuate certain frequencies. Examples of these filters may include highpass, lowpass, bandpass and/or shelving filters.

In a particular example embodiment of FIG. 10, the input or output filters can be constructed by using a series of cascaded bi-quad filters. The system setup shown in FIG. 10 can both be used in configurations involving mono, stereo, or multi-channels.

Figure 11:
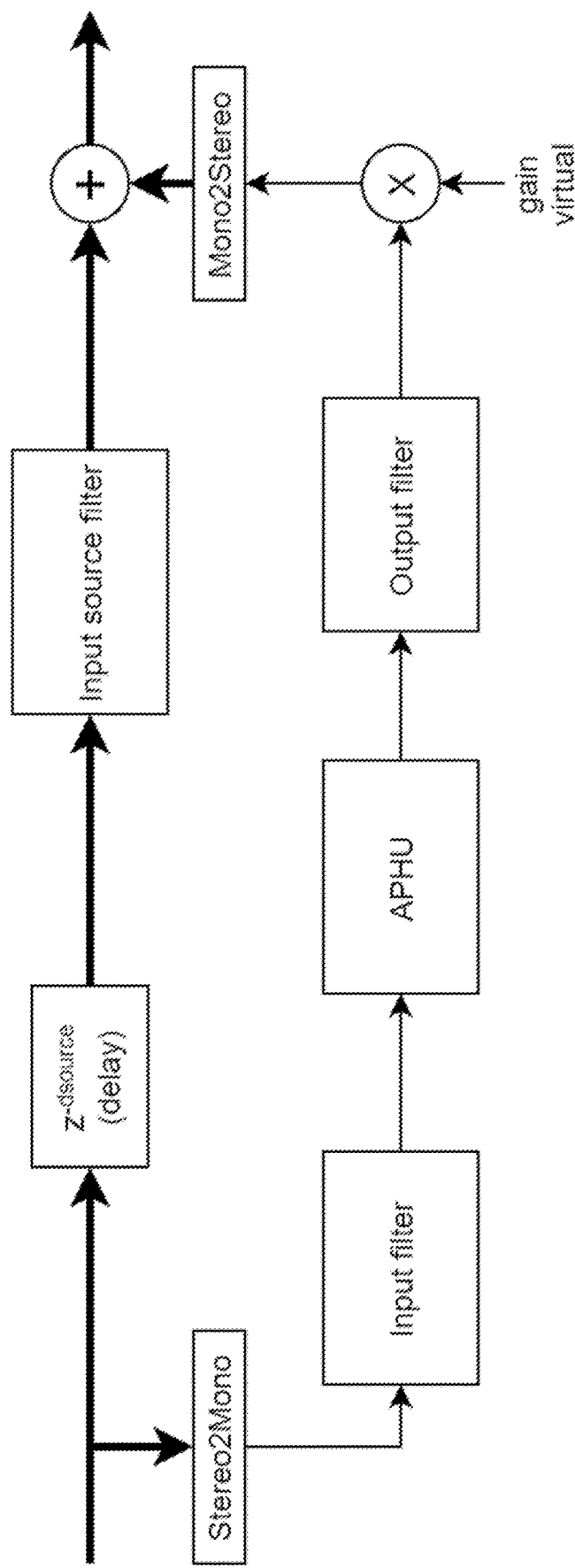
FIG. 11 is a schematic diagram that shows an example embodiment of a system configuration where the input signal is a stereo signal that is first converted to a mono signal.

FIG. 11 is a schematic diagram that shows an example embodiment of a system configuration where the input signal is a stereo signal that is first converted to a mono signal. The input (source) signal can be delayed in time (if needed), but the delay "dsource" can also be set to 0. In an example embodiment, the source signal is filtered by an input source filter before it is combined (added) with the filtered and scaled harmonics series that have been generated in the APHU branch. In a particular example embodiment, the "gain virtual" can be set to 1.

Figure 12:
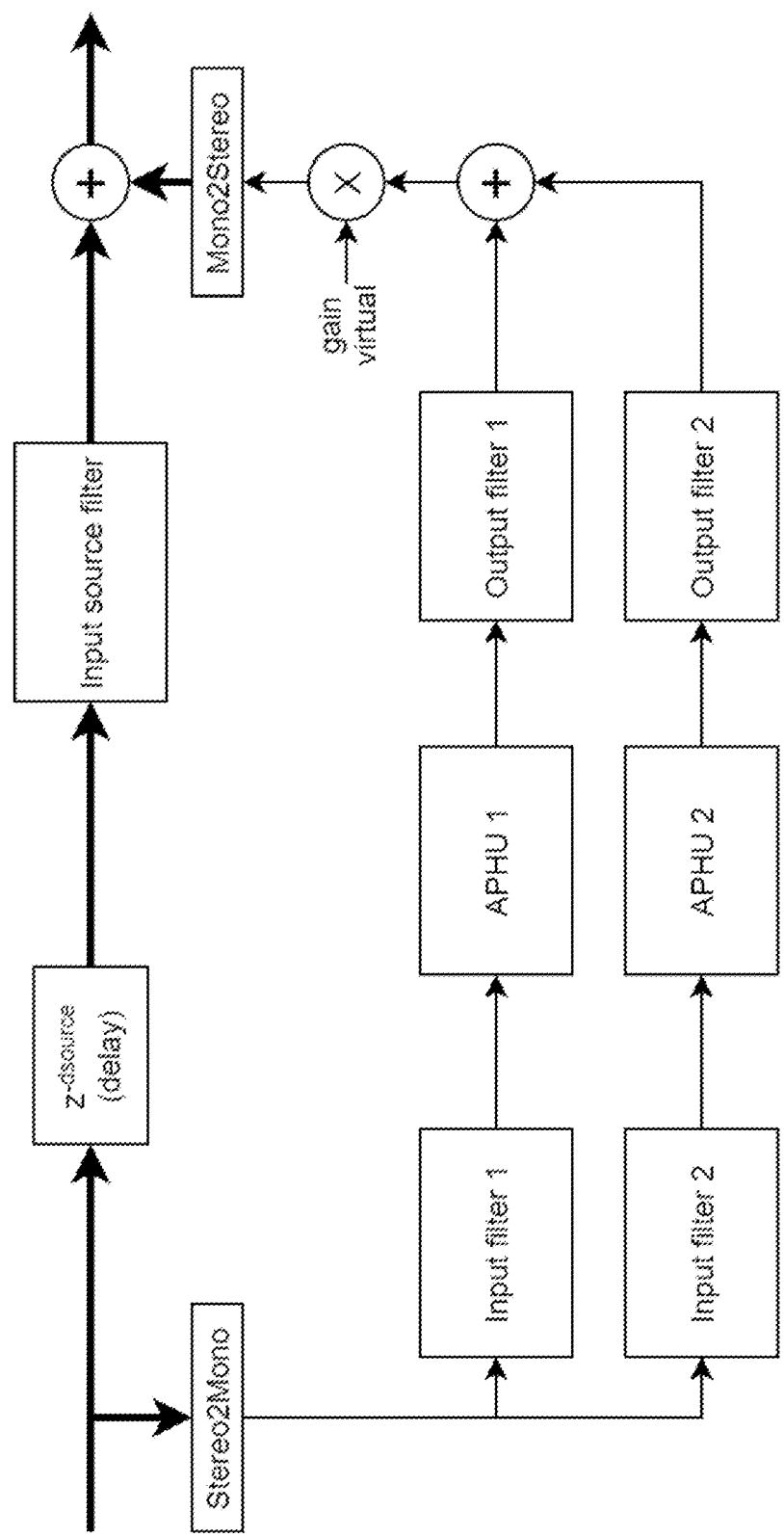
FIG. 12 is a schematic diagram that shows an example embodiment of a system configuration where the system in FIG. 11 has been extended with an additional APHU processing branch.

FIG. 12 is a schematic diagram that shows an example embodiment of a system configuration where the system in FIG. 11 has been extended with an additional APHU processing branch. Before the processing by the 2 APHUs, the input spectrum is divided into small sub-bands. This will allow separate harmonics generators for each branch and reduce intermodulation distortion produced during harmonics generation in the event that more than one strong low frequency component may be present at the input of the harmonics generator. Therefore, the 2 input filters, 2 APHU's, and 2 output filters will process the mono signal in two parallel branches before they are combined (added together) into one signal that is then scaled by a scalar "gain virtual". Next the mono signal is converted to a stereo signal before it is combined (added) with either the input source signal or a filtered version of it.

Figure 13:
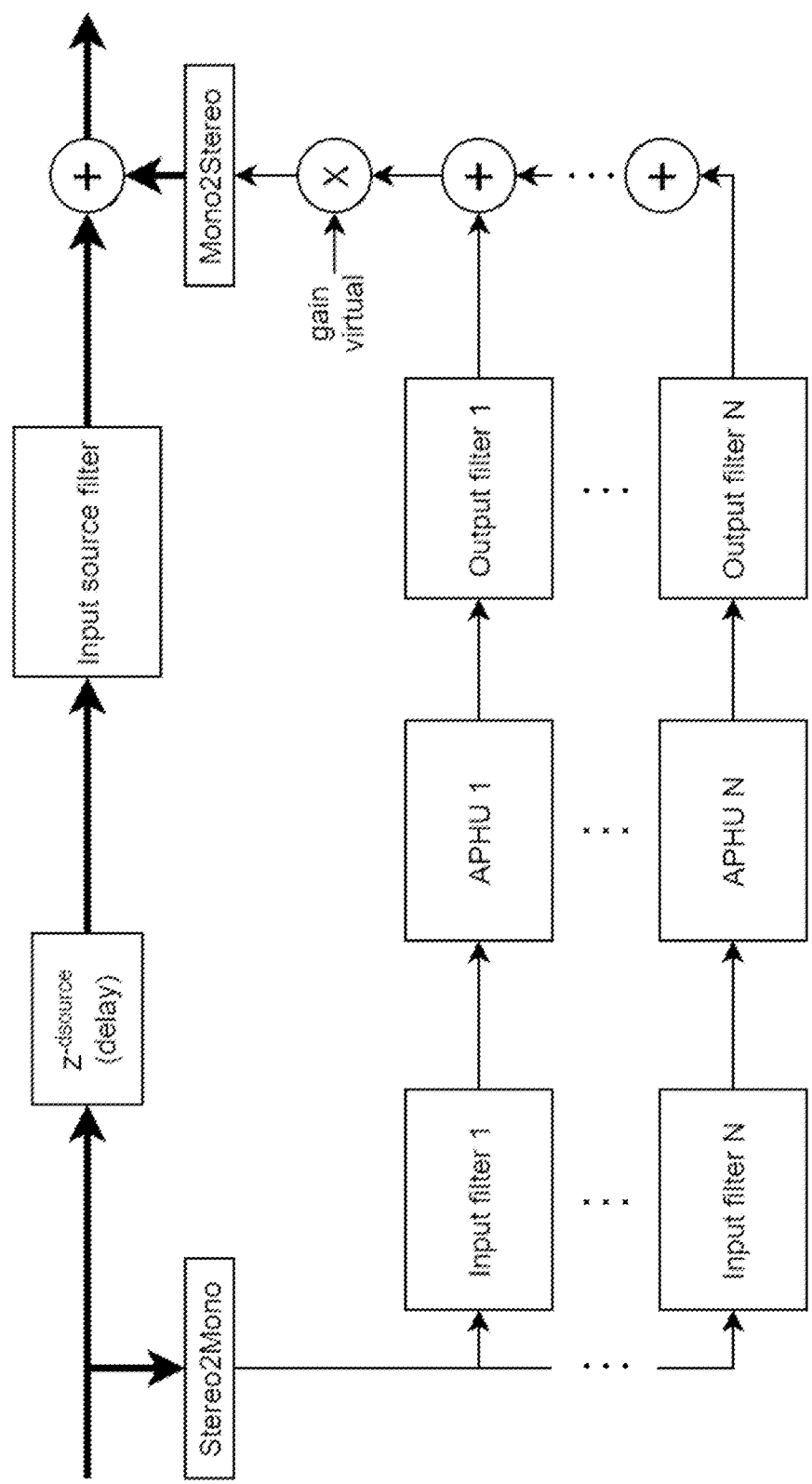
FIG. 13 is a schematic diagram that shows an example embodiment of a system configuration where there are N≥2 parallel branches that are used for generating harmonic series.

FIG. 13 is a schematic diagram that shows an example embodiment of a system configuration where there are N≥2 parallel branches that are used for generating harmonic series. Since the example diagram of FIG. 12 shows two branches, the example diagram of FIG. 13 may be envisioned as having more than two branches, all together encompassing the concept of having N≥2 parallel branches. Typically, each section is configured for a respective sub-band, and all branches are then tuned jointly to achieve an overall well-behaved system.

For a better understanding of the present invention, a more detailed but non-limiting discussion and disclosure of implementations will now be given:

As previously mentioned, in a particular example embodiment, it is feasible to build a core harmonics generator using the following key building blocks:

ABS/NLD function (full wave rectifier): generates even harmonics and preserves the level.

SIGN function: generates odd harmonics with a fixed level regardless of input level (i.e. it normalizes the input).

Low pass filtered SIGN function: for a suitably chosen cutoff somewhere between 1st and 3rd harmonic, the output will approximate the 1st harmonic (i.e. the fundamental), but level normalized.

Mixing multiplication: The product of two sine functions leads to two sines having frequencies corresponding to the sum and difference of the input frequencies.

As previously mentioned, it is also possible to use a Sign Sequence Unit (SSU) for producing a new square waveform with a period according to the pure tone input and choice of configuration of the divider and/or multiplier As illustrated in FIG. 5A, the ABS( ) function, which is an absolute value function, returns amplitude proportional even harmonics. Using SIGN( ) and a lowpass filter, an estimate of the normalized fundamental is achieved. The multiplication of this estimate with the ABS( ) output generates an amplitude proportional odd harmonic series. The generated even/odd harmonic series have comparable harmonic amplitude distributions and can be blended smoothly in practice by simple gain adjustments (gain_a/gain_b).

By way of example, feeding a pure tone input to the APHU in FIG. 5A produces a full harmonic series with a certain timbre. It would be possible to control the timbre by applying a harmonic shaping filter as a post-filtering operation, e.g. a bandpass filter.

In effect, it may be desirable to adjust one or more of the following blocks and/or settings, e.g. in real-time while listening to tone sweeps and/or selected music material (tuning):

Filter "H_APHU" (the filter after SIGN( ) function in the APHU block),

Scaling factors: "gain a" and "gain b",

A post-processing harmonic shaping filter, so as to produce harmonics leaving an impression of clean/good sounding pure tones for a given input frequency range. This could be part of a tuning process, e.g. performed by an audio engineer.

All in all, it turns out that this unique combination of properly configured blocks and/or modules possesses one or more of the following qualities:

Amplitude proportional in a simple and effective way;

Sound quality, the timbre that can be achieved (when combined with a harmonics output filter);

Sound quality, a good transient response (due to limited internal signal memory); and DSP code and run-time complexity, using e.g. cascaded biquads to realize the different filtering steps (i.e. the input filter, H_APHU, and output filter).

With reference once again to FIG. 11, a single band virtual bass architecture may be built around an APHU by simple filtering stages, e.g. using the below given non-limiting example settings:

Input filter:

Shapes the input to the APHU according to the desired bandwidth (e.g. 20-75 Hz).

Output filter:

Shapes the output harmonics according to the speaker properties and the desired virtual bass timbre (e.g. 75 Hz to 140 Hz).

Input source filter:

High pass filter to remove low frequency energy that the speaker cannot reproduce In a particular example implementation, all filters (H_APHU, Input filter, Output filter, Input source filter) may be implemented as cascaded biquad sections. This is beneficial from a DSP implementation and run-time complexity perspective, as well as limiting the number of tuning handles to well-known high level biquad design parameters.

Figure 14:
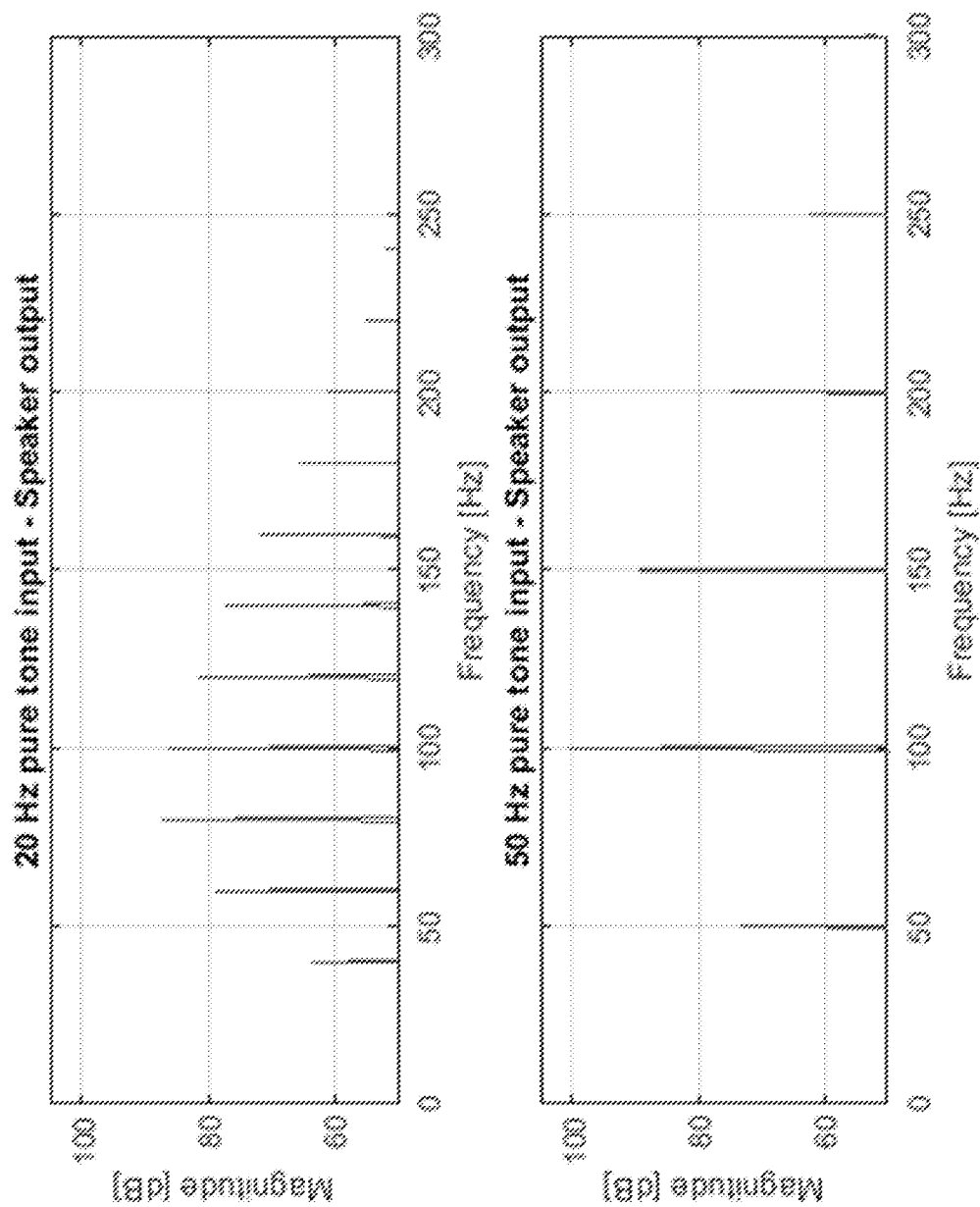
FIG. 14 is a schematic diagram illustrating an example of how even and odd harmonics blend together nicely using the APHU processing system.

FIG. 14 is a schematic diagram illustrating an example of how even and odd harmonics blend together nicely using the APHU processing system.

Notice from the plot in FIG. 14 how even and odd harmonics blend together nicely using the APHU processing system in FIG. 11.

Pure tone speaker response examples:

20 Hz input:

Even: 40, 80, 120, . . .

Odd: 20, 60, 100, 140, . . .

50 Hz input:

Even: 100, 200, . . .

Odd: 50, 150, 250, . . .

While the presented innovation concerns a general method for generating harmonics, it will in many cases be found that the presented innovation is most suitable to be used as part of a non-limiting framework for bass enhancement.

Figure 15:
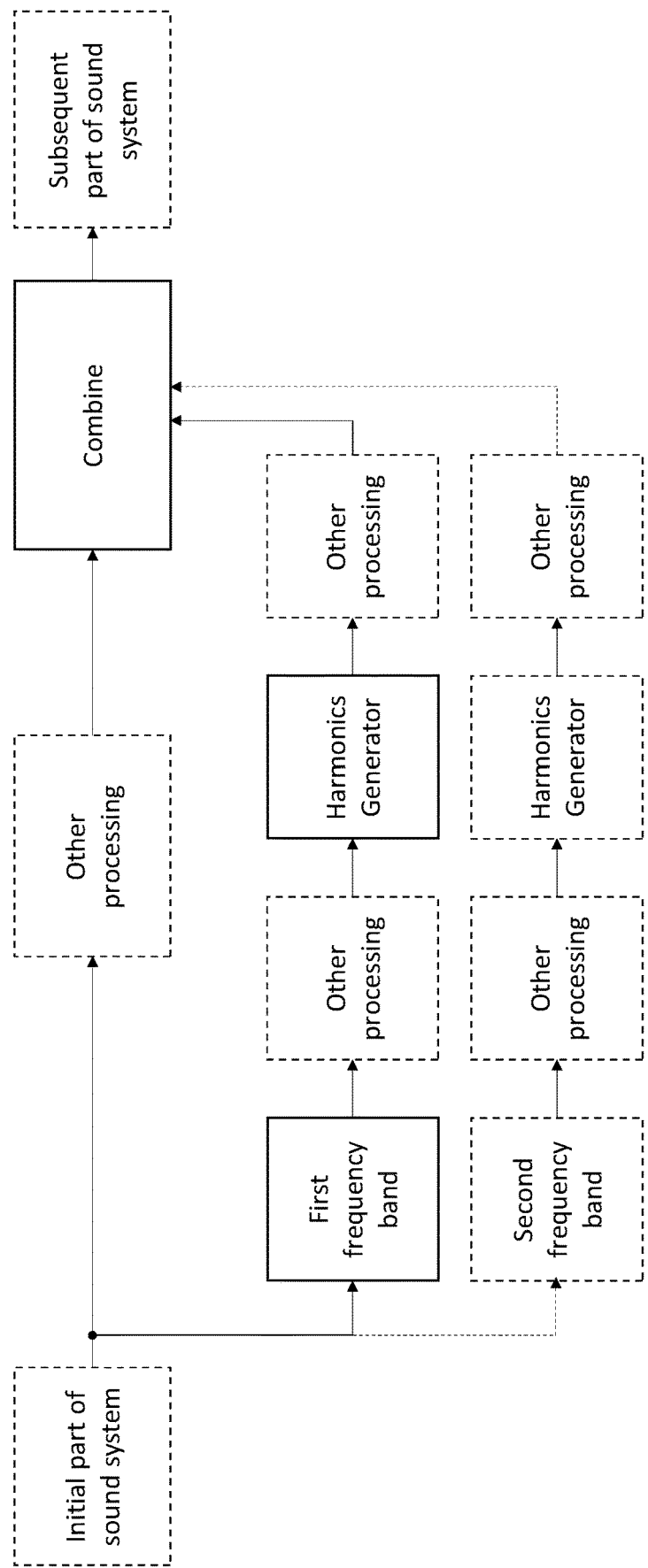
FIG. 15 is a schematic diagram illustrating an example of a framework for bass enhancement.

FIG. 15 is a schematic diagram illustrating an example of such a framework. The non-optional blocks include first a block for selecting a frequency range of interest, where there are fundamental components from which it is desirable to generate harmonics. Typically, this is implemented using a low pass filter or a band pass filter. The output of said block, containing a signal with limited bandwidth, is passed to the harmonics generator and the generated harmonics are re-combined with another signal, that comprises all the audible frequencies of the input signal. This will create an output signal comprising both unaltered high frequency components and harmonics generated from low frequency components, so that the listener can hear a signal related to both high and low frequency fundamentals.

Some basic additions to the above framework are also possible, but not strictly necessary for the basic operation. More than one frequency band may be extracted in parallel to the first frequency band and passed to another harmonics generator before re-combining with the higher frequencies. Some additional processing may also be applied before or after the harmonics generators, such as compressors, filters etc. to furthermore shape the signal. These can be placed both before/after the harmonics generator or both. Likewise, some additional processing may be applied to the upper branch of FIG. 15. This could be a high pass filter, removing frequency components of those frequencies from which harmonics are generated. A compressor could also be placed here. It should be noticed that many more options that do not affect the spirit of the harmonics generator itself are possible. We now leave this framework and move on to describing the harmonics generator, under the assumption that is placed into the minimal version of the described framework.

When generating harmonics at integer multiples from a fundamental frequency, which may be referred to as natural harmonics, the missing fundamental phenomenon essentially states that the two lowest harmonics above the cutoff frequency, fc, of the sound reproduction must have a significant amplitude in the output signal in order to convey the illusion of a low-frequency fundamental. The possible harmonics to choose from are then spaced by the fundamental frequency, which means that the distance in frequency between the possible harmonics is higher, the higher the fundamental frequency. For a fundamental just below fc, this means that harmonics at almost 2 and 3 times fc must be generated. For lower fundamentals, the spacing between the harmonics is also smaller, so harmonics closer to the cutoff frequency may be used to provide the same effect.

Figure 16:
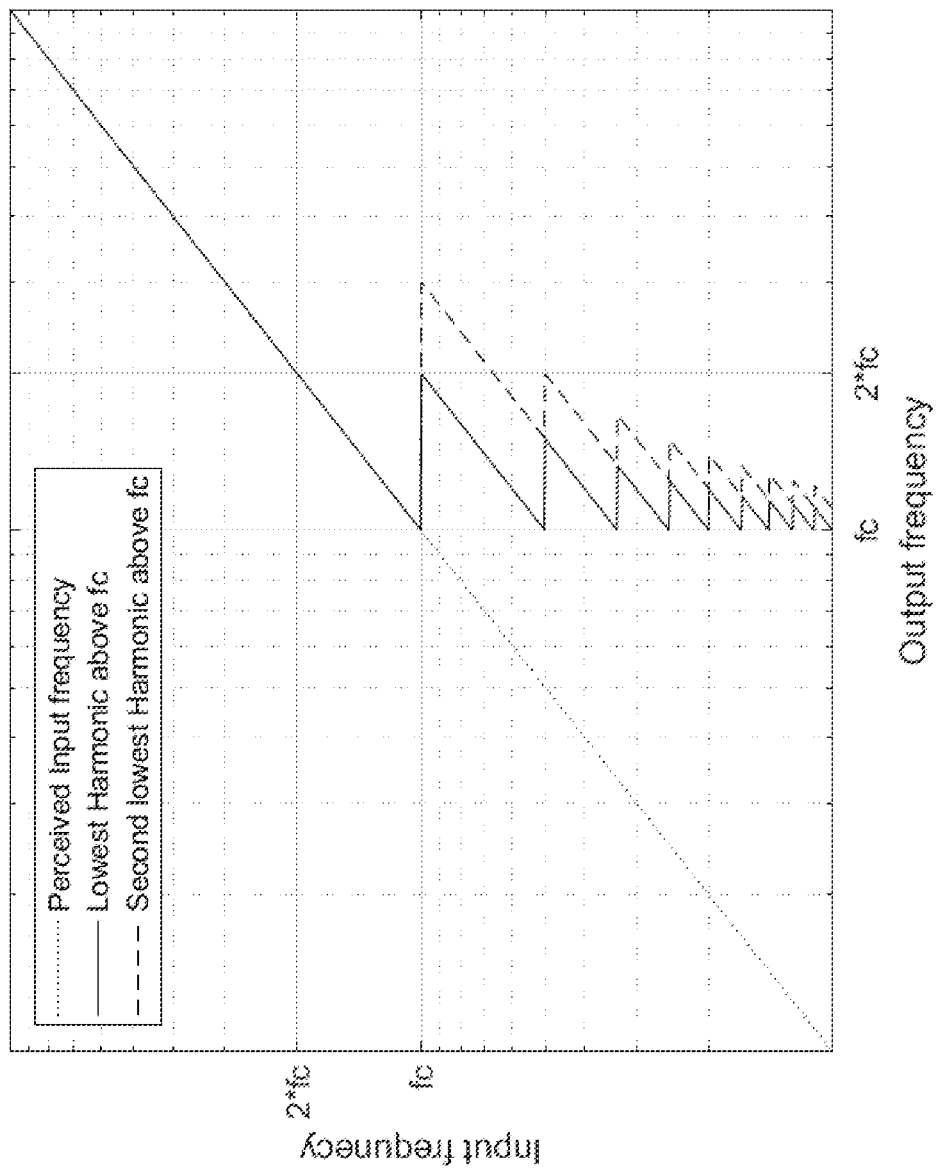
FIG. 16 is a schematic diagram illustrating an example of two harmonics of lowest order above the cutoff frequency, fc, for an input frequency.

Take for example a system with a fc at 100 Hz. Then, for a 95 Hz fundamental, harmonics 190 and 285 Hz respectively are required. If on the other hand the fundamental is at 45 Hz, then harmonics at 135 and 180 Hz suffice. FIG. 16 illustrates this concept, by showing the two harmonics of lowest order above the cutoff for an input frequency. It can be seen that the highest fundamentals below the cutoff are associated with the highest harmonic frequencies.

The inventors have found that this problem can be addressed by also generating fractional harmonics, particularly at 3/2 of the fundamental frequency. Typically, this harmonic will be combined with the harmonic at 2× the fundamental frequency. As these two tones represent the harmonics at 3 and 4 times of a tone at ½ of the fundamental frequency, the missing fundamental phenomenon enables the listener to perceive a fundamental at ½ of the fundamental frequency of the input signal. On a musical scale however, this is only an octave shift. The tone said to be the same, but played one octave lower. Hence, the musical content is not altered.

When this is performed, the harmonic at 3× the fundamental frequency can be omitted, as there are already two harmonic components available at lower frequencies. Hence, the timbre of the harmonics series will be more focused towards lower frequencies, yielding a better listening experience. Furthermore, the upper limit if the band pass filter after the harmonics generation unit(s) may be lowered.

Figure 17:
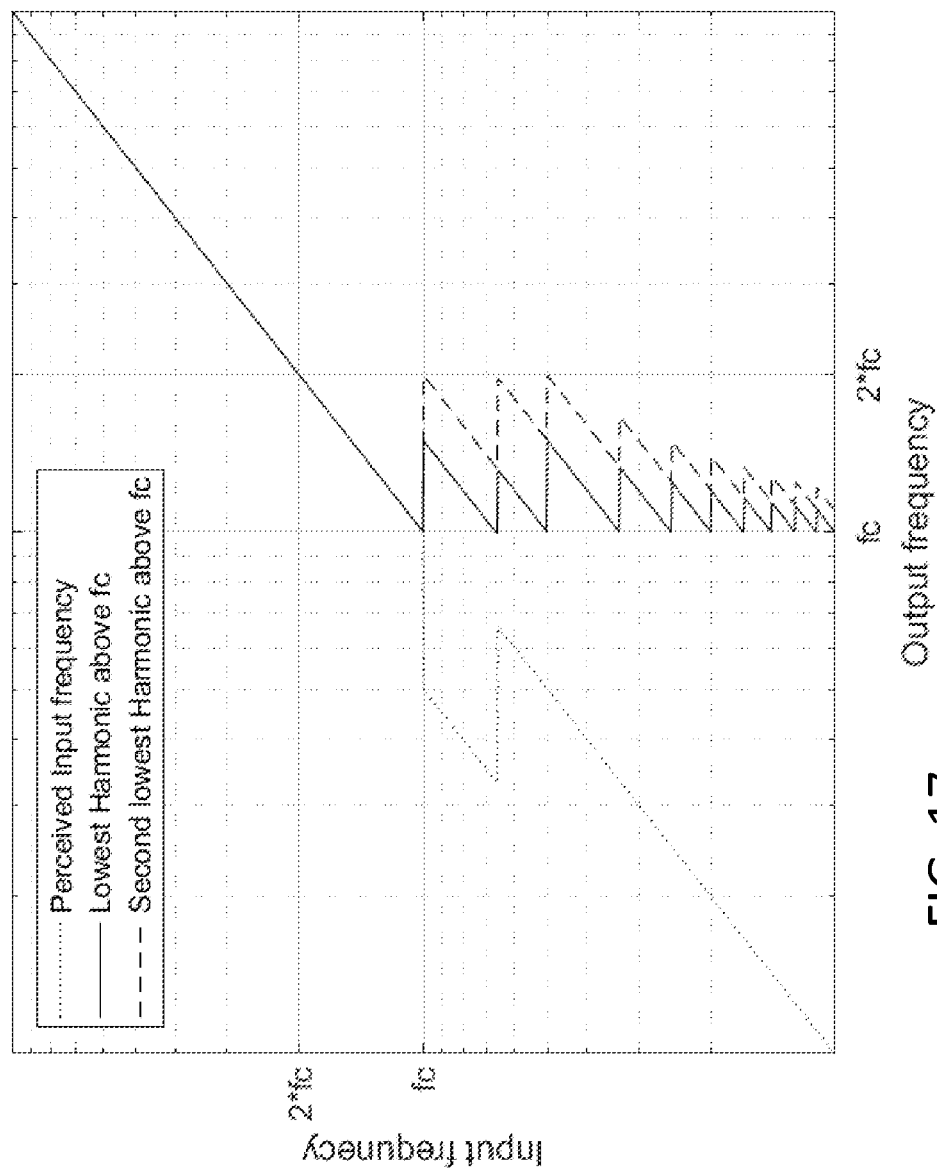
FIG. 17 is a schematic diagram illustrating a counterpart example of FIG. 16, showing the two lowest harmonics above the cutoff frequency from the set of natural harmonics and a harmonic at 3/2 of the fundamental frequencies.

FIG. 17 is the counterpart of FIG. 16, showing the two lowest harmonics above the cutoff frequency from the set of all natural harmonics and a harmonic at 3/2 of the fundamental frequencies. As can be seen, the highest used harmonic component is here in a lower frequency range than in FIG. 16. This comes at the cost of the perceived fundamental frequency not being the same as the input fundamental frequency.

Figure 18:
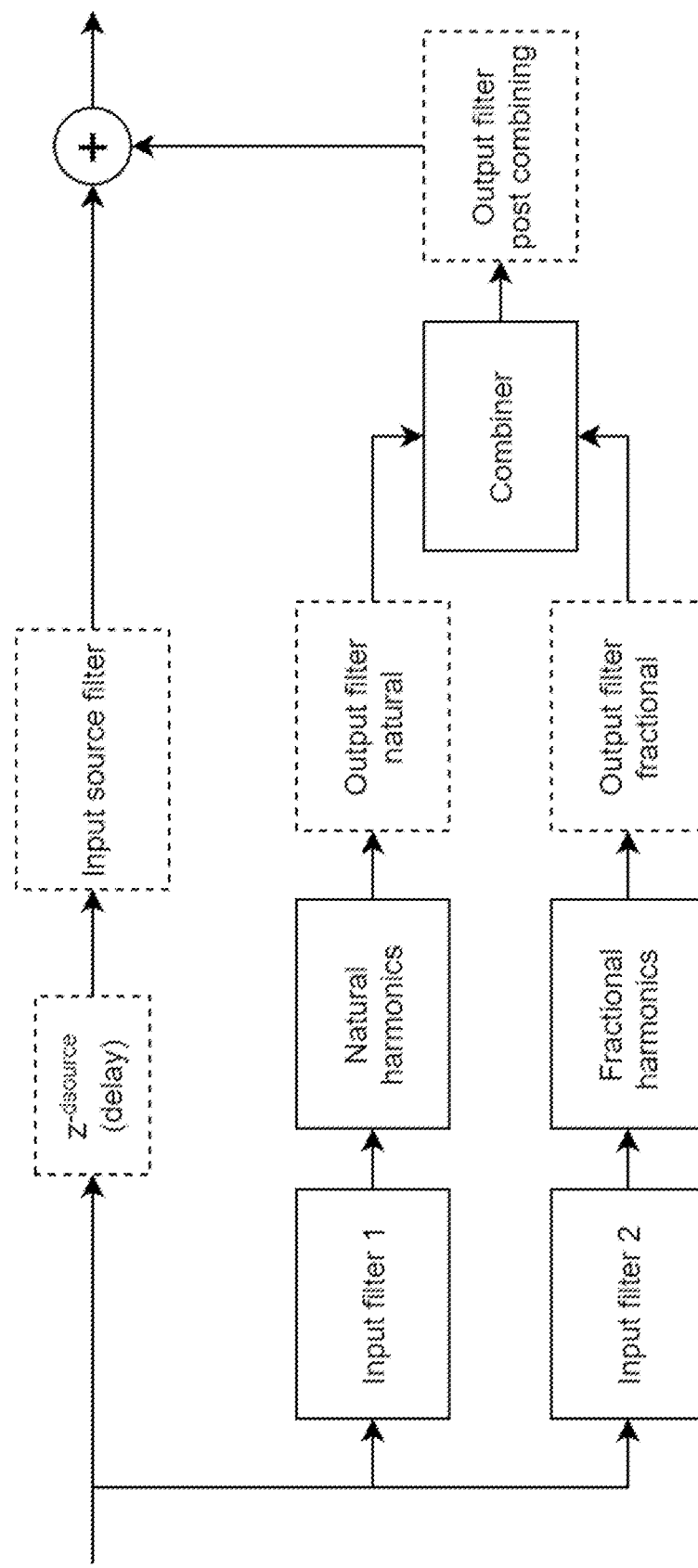
FIG. 18 is a schematic diagram illustrating an example of how natural harmonics generation and fractional harmonics generation arranged in parallel branches and subsequently combined.

By way of example, e.g. as schematically illustrated in FIG. 18, this strategy may be implemented using two parallel APHU branches/units: one configured to generate integer-order harmonics of the fundamental frequency and one configured to generate at least a fractional harmonic at 3/2 of the input frequency.

The fractional harmonics are mostly of interest for the higher range of fundamentals below the cut-off frequency. In practice, they will also be mixed with a subtle fundamental frequency below fc or a low-level harmonic at 2× the input, since both the lower cutoff of the system and various band limiting filters have finite slopes, and therefore provide a bit of a leakage signal outside of their cutoff frequency. This is typically sufficient for providing the illusion of a low-frequency fundamental. With this in place, the natural harmonics only need to be provided at full amplitude when the fundamental is significantly below the cutoff frequency. Hence, one may set upper band limit of the filter associated with the input to the fractional harmonics generator unit higher than the upper band limit of the filter associated with the input to the natural harmonics generator unit.

In a general form however, the same effect may be achieved by any arbitrary method for generating the natural harmonics, the fractional harmonics or both. In this general form, the method is characterized in the use of two frequency bands derived from the input signal, wherein at least one band is used as the input of a natural harmonics generator unit and one band is used as the input of a fractional harmonics generator unit. Said fractional harmonics generator generates at least a component at 3/2 of the fundamental frequency. The generated natural harmonics series and/or fractional harmonics series may be further modified by e.g. a low pass or band pass filter. The natural and fractional harmonics signals are combined into a harmonics signal. Said harmonics signal may be further modified by e.g. a low pass or band pass filter. The harmonics signal is then combined with the input signal or another signal derived therefrom to create an output signal. More specifically, the general form may also have an upper band limit of the filter associated with the input to the fractional harmonics generator unit higher than the upper band limit of the filter associated with the input to the natural harmonics generator unit.

Figure 19:
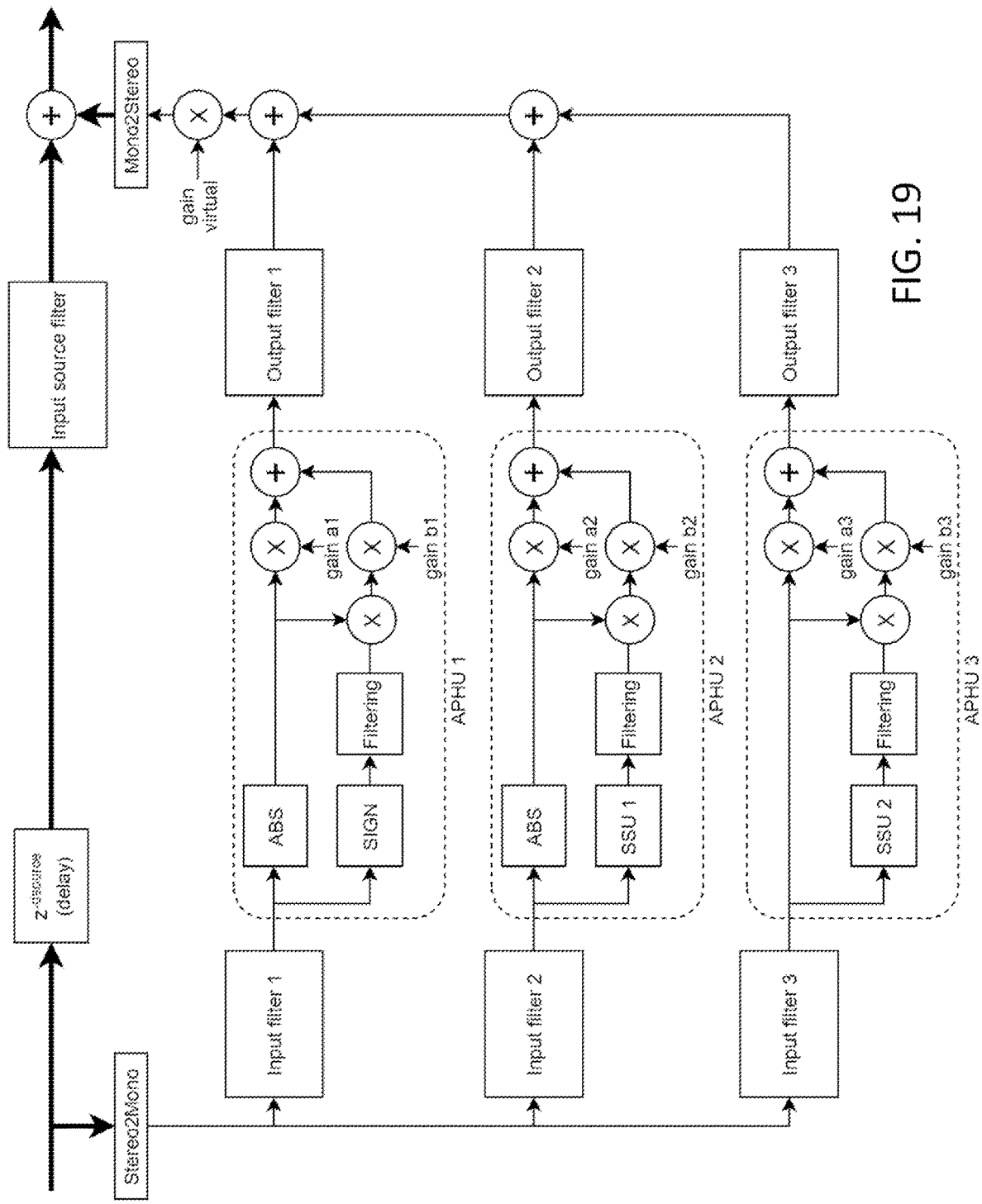
FIG. 19 is a schematic diagram illustrating an example of a system with multiple parallel branches, each holding a different configuration of the APHU.

FIG. 19 is a schematic diagram illustrating an example of a system with multiple parallel branches, each holding a different configuration of the APHU.

In a particular non-limiting example, the system comprises three parallel branches combining different APHU "types":
Branch 1: generates only natural (even+odd) harmonics.
Branch 2: generates a combination of fractional and natural harmonics.
Branch 3: generates only fractional harmonics, e.g. 1½ only.

It will be appreciated that the methods and arrangements described herein can be implemented, combined and re-arranged in a variety of ways.

By way of example, there is provided an apparatus configured to perform the method as described herein.

For example, embodiments may be implemented in hardware, or in software for execution by suitable processing circuitry, or a combination thereof.

The steps, functions, procedures, modules and/or blocks described herein may be implemented in hardware using any conventional technology, such as discrete circuit or integrated circuit technology, including both general-purpose electronic circuitry and application-specific circuitry.

Alternatively, or as a complement, at least some of the steps, functions, procedures, modules and/or blocks described herein may be implemented in software such as a computer program for execution by suitable processing circuitry such as one or more processors or processing units.

Examples of processing circuitry includes, but is not limited to, one or more microprocessors, one or more Digital Signal Processors (DSPs), one or more Central Processing Units (CPUs), video acceleration hardware, and/or any suitable programmable logic circuitry such as one or more Field Programmable Gate Arrays (FPGAs), or one or more Programmable Logic Controllers (PLCs).

It should also be understood that it may be possible to re-use the general processing capabilities of any conventional device or unit in which the proposed technology is implemented. It may also be possible to re-use existing software, e.g. by reprogramming of the existing software or by adding new software components.

It is also possible to provide a solution based on a combination of hardware and software. The actual hardware-software partitioning can be decided by a system designer based on a number of factors including processing speed, cost of implementation and other requirements.

According to a seventh aspect, there is provided a computer program for generating, when executed by a processor, harmonics from an input signal having an input frequency, wherein the computer program comprises instructions, which when executed by the processor, cause the processor to perform the method described herein.

According to an eighth aspect, there is provided a computer-program product comprising a non-transitory computer-readable medium having stored thereon a computer program according to the seventh aspect.

Figure 20:
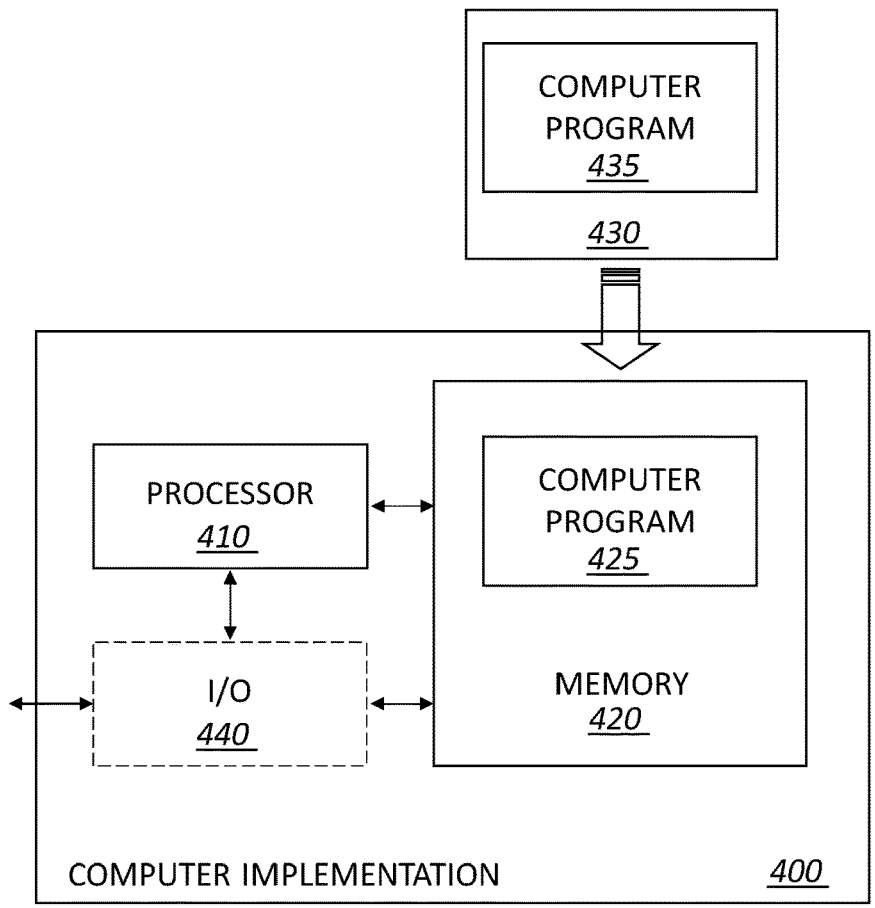
FIG. 20 is a schematic diagram illustrating an example of a computer-implementation according to an embodiment.

FIG. 20 is a schematic diagram illustrating an example of a computer-implementation according to an embodiment. In this particular example, at least some of the steps, functions, procedures, modules and/or blocks described herein are implemented in a computer program 425; 435, which is loaded into the memory 420 for execution by processing circuitry including one or more processors 410. The processor(s) 410 and memory 420 are interconnected to each other to enable normal software execution. An optional input/output device 440 may also be interconnected to the processor(s) 410 and/or the memory 420 to enable input and/or output of relevant data such as input parameter(s) and/or resulting output parameter(s).

The term 'processor' should be interpreted in a general sense as any system or device capable of executing program code or computer program instructions to perform a particular processing, determining or computing task.

The processing circuitry including one or more processors 410 is thus configured to perform, when executing the computer program 425, well-defined processing tasks such as those described herein.

The processing circuitry does not have to be dedicated to only execute the above-described steps, functions, procedure and/or blocks, but may also execute other tasks.

In a particular embodiment, the computer program 425; 435 comprises instructions, which when executed by the processor 410, cause the processor 410 to perform the tasks described herein.

The proposed technology also provides a carrier comprising the computer program, wherein the carrier is one of an electronic signal, an optical signal, an electromagnetic signal, a magnetic signal, an electric signal, a radio signal, a microwave signal, or a computer-readable storage medium.

By way of example, the software or computer program 425; 435 may be realized as a computer program product, which is normally carried or stored on a non-transitory computer-readable medium 420; 430, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

The procedural flows presented herein may be regarded as a computer flows, when performed by one or more processors. A corresponding apparatus may be defined as a group of function modules, where each step performed by the processor corresponds to a function module. In this case, the function modules are implemented as a computer program running on the processor.

The computer program residing in memory may thus be organized as appropriate function modules configured to perform, when executed by the processor, at least part of the steps and/or tasks described herein.

Alternatively, it is possible to realize the function modules predominantly by hardware modules, or alternatively by hardware, with suitable interconnections between relevant modules. Particular examples include one or more suitably configured digital signal processors and other known electronic circuits, e.g. discrete logic gates interconnected to perform a specialized function, and/or Application Specific Integrated Circuits (ASICs) as previously mentioned. Other examples of usable hardware include input/output (I/O) circuitry and/or circuitry for receiving and/or sending signals. The extent of software versus hardware is purely implementation selection.

The embodiments described above are merely given as examples, and it should be understood that the proposed technology is not limited thereto. It will be understood by those skilled in the art that various modifications, combinations and changes may be made to the embodiments without departing from the present scope as defined by the appended claims. In particular, different part solutions in the different embodiments can be combined in other configurations, where technically possible.

REFERENCES

[1] NAY OO; WOON-SENG GAN: "Perceptually-Motivated Objective Grading of Nonlinear Processing in Virtual-Bass Systems", Journal of the Audio Engineering Society, November 2011

[2] RONALDUS M. AARTS; STEPHANUS P. STRAETE-MANS: "Circuit, Audio System and Method for Processing Signals, and a Harmonics Generator", U.S. Pat. No. 6,111,960, Aug. 29, 2000.
[3] HSIN-YUAN CHIU; TSUNG-FU LIN: "Virtual Bass Generating Circuit and Method", US 2019/0238979A1, August 2019.
[4] ADAM J. HILL: "Analysis, Modeling and Wide-Area Spatiotemporal Control of Low-Frequency Sound Reproduction", Thesis, University of Essex, January 2012, Chapter 6.
[5] Nay Oo, "Theoretical Analysis and Perceptual Evaluations on Nonlinear Devices in Virtual Bass System" Doctor of Philosophy thesis, 2012. Nanyang Technological University.
[6] THOMAS C. BARTEE: "Digital Computer Fundamentals", McGraw-Hill Kogakusha, International Student Edition, 1972.
[7] Wee-Tong Lim and Nay Oo, and Woon-Seng Gan: "Synthesis of Polynomial-Based Nonlinear Device and Harmonic Shifting Technique for Virtual Bass System", 2009 IEEE International Symposium on Circuits and Systems, 2009.

The invention claimed is:

1. A system for generating harmonics, said system comprising:
   an input for receiving an input signal having a fundamental frequency;
   at least two signal paths:
   a first signal path configured to receive the input signal and configured to generate a first amplitude proportional signal comprising one or more harmonics components based on the input signal, said first amplitude proportional signal having an amplitude proportional to the amplitude of the input signal;
   a second signal path configured to receive the input signal, said second signal path comprising at least one signal processing block configured to i) generate a normalized signal based on the input signal, said normalized signal having an amplitude independent of the amplitude of the input signal, and ii) multiply the normalized signal with the first amplitude proportional signal to generate a second amplitude proportional signal comprising one or more harmonics components; and
   a combiner configured to generate an output signal based on the first amplitude proportional signal comprising one or more harmonics components and the second amplitude proportional signal comprising one or more harmonics components,
   wherein said second signal path comprises:
   a SIGN unit for generating a sequence of changing signs alternating at a rate dictated by the fundamental frequency of the input signal,
   a filtering unit configured to filter the sequence of changing signs to generate the normalized signal having an amplitude independent of the amplitude of the input signal, and
   a mixing multiplier configured to multiply the normalized signal with the first amplitude proportional signal to generate the second amplitude proportional signal.

2. The system for generating harmonics of claim 1, wherein said first signal path is configured to generate the first amplitude proportional signal as having one or more natural harmonics, and wherein said second signal path is configured to generate the second amplitude proportional signal as having one or more natural harmonics or as having one or more fractional harmonics.

3. The system for generating harmonics of claim 2, wherein said first signal path is configured to generate the first amplitude proportional signal as including an even harmonics series, and said second signal path is configured to generate the second amplitude proportional signal as including an odd harmonics series.

4. The system for generating harmonics of claim 2, wherein said first signal path is configured to generate the first amplitude proportional signal as including an even or odd harmonics series, and said second signal path is configured to generate the second amplitude proportional signal as including at least one fractional harmonics component.

5. The system for generating harmonics of claim 1, wherein the SIGN unit and the filtering unit are configured to generate the normalized signal as one or more filtered sign sequences that are used as amplitude independent estimates of the fundamental frequency of the input signal.

6. The system for generating harmonics of claim 1, wherein said second signal path further comprises a frequency divider or multiplier arranged between the SIGN unit and the filtering unit to produce a sequence of changing signs with a period according to the pure tone input and configuration/setting of the frequency divider or multiplier, wherein said filtering unit is configured to receive said sequence of changing signs to generate the normalized signal, thereby enabling fractional harmonics to be generated as part of the second amplitude proportional signal when the normalized signal is multiplied with the first amplitude proportional signal.

7. The system for generating harmonics of claim 1, wherein said first signal path comprises at least one signal processing block configured to generate the first amplitude proportional signal, wherein said at least one signal processing block of the first signal path comprises a Non-Linear Device, NLD, configured to participate in generating the first amplitude proportional signal, wherein the NLD comprises an absolute value unit, ABS, for generating a series of natural harmonics that scales proportionally to the input signal.

8. The system for generating harmonics of claim 1, wherein said first signal path is configured to pass-through the input signal as the first amplitude proportional signal.

9. The system for generating harmonics of claim 1, wherein the system further comprises a first gain multiplier configured to scale the first amplitude proportional signal and/or a second gain multiplier configured to scale the second amplitude proportional signal, wherein the combiner is configured to receive the scaled first amplitude proportional signal and/or the scaled second amplitude proportional signal as input for generating the output signal.

10. A system for generating a virtual bass signal, also referred to as a psycho-acoustic bass sensation signal, said system for generating a virtual bass signal comprising the system for generating harmonics of claim 1.

11. An arrangement comprising multiple instances of the system for generating harmonics of claim 1, said multiple instances of the system for generating harmonics being arranged in parallel, wherein each instance is targeting an individual frequency band of the input signal.

12. A method for generating harmonics based on an input signal having a fundamental input frequency, said method comprising:

deriving, from the input signal, one or more frequency band signals;

generating, from at least one or each of said frequency band signals, a first amplitude proportional signal comprising one or more harmonics components, said first amplitude proportional signal having an amplitude proportional to the amplitude of the input signal;

generating, from at least one or each of said frequency band signals, a normalized signal, said normalized signal having an amplitude independent of the amplitude of the input signal, and multiplying, for at least one or each of said frequency band signals, the normalized signal with the corresponding first amplitude proportional signal to generate a second amplitude proportional signal comprising one or more harmonics components;

creating, for at least one or each of said frequency band signals, an output signal based on the first amplitude proportional signal comprising one or more harmonics components and the second amplitude proportional signal comprising one or more harmonics components, wherein said step of generating, from at least one or each of said frequency band signals, a normalized signal comprises generating a sign sequence from said at least one or each of said frequency bands signals, and applying a filter to said sign sequence to create a filtered sign sequence signal.

13. The method of claim 12, wherein the first amplitude proportional signal includes one or more natural harmonics, and the second amplitude proportional signal includes one or more natural harmonics or one or more fractional harmonics.

14. The method of claim 13, wherein the first amplitude proportional signal includes an even harmonics series, and the second amplitude proportional signal includes an odd harmonics series.

15. The method of claim 13, wherein the first amplitude proportional signal includes an even or odd harmonics series, and the second amplitude proportional signal includes at least one fractional harmonics component.

16. The method of claim 12, wherein said step of generating, from at least one or each of said frequency band signals, a first amplitude proportional signal comprises using the frequency band signal as input to a Non-Linear Device, NLD, and using the output of the NLD as the amplitude proportional signal.

17. The method of claim 12, wherein said step of generating, from at least one or each of said frequency band signals, a normalized signal further comprises using said filtered sign sequence signal as input to a further NLD and using the output of said further NLD as the normalized amplitude signal.

18. The method of claim 12, wherein said step of generating, from at least one or each of said frequency band signals, a normalized signal further comprises manipulating the change-rate of the sign sequence.

19. The method of claim 12, wherein said step of creating, for at least one or each of said frequency band signals, an output signal comprises providing weighted versions of the first amplitude proportional signal and the second amplitude proportional signal and combining the weighted versions to generate the output signal.

20. A non-transitory computer-readable storage medium having stored thereon a computer program for generating, when executed by a processor, harmonics from an input signal having an input frequency, wherein the computer program comprises instructions, which when executed by the processor, cause the processor to perform the method of claim 12.

* * * * *